(12) United States Patent
Saga

(10) Patent No.: US 11,705,805 B2
(45) Date of Patent: Jul. 18, 2023

(54) SHORT CIRCUIT PROTECTION APPARATUS FOR POWER CONVERSION APPARATUS

(71) Applicant: FUJI ELECTRIC CO., LTD., Kawasaki (JP)

(72) Inventor: Yasunao Saga, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/589,211

(22) Filed: Jan. 31, 2022

(65) Prior Publication Data

US 2022/0302821 A1 Sep. 22, 2022

(30) Foreign Application Priority Data

Mar. 17, 2021 (JP) .................................. 2021-043060

(51) Int. Cl.
| | |
|---|---|
| *H02M 1/32* | (2007.01) |
| *G01R 15/18* | (2006.01) |
| *H02H 7/122* | (2006.01) |
| *H02H 3/087* | (2006.01) |

(52) U.S. Cl.
CPC ............ *H02M 1/32* (2013.01); *G01R 15/181* (2013.01); *H02H 3/087* (2013.01); *H02H 7/1227* (2013.01)

(58) Field of Classification Search
CPC .................... H02M 1/32; G01R 15/181; H02H 7/122–1227; H02H 3/087
See application file for complete search history.

(56) References Cited

U.S. PATENT DOCUMENTS

| 2013/0176071 A1 | 7/2013 | Kim |
| 2016/0112043 A1 | 4/2016 | Hayashiguchi et al. |
| 2017/0134018 A1* | 5/2017 | Imanishi ................. H02M 1/32 |

FOREIGN PATENT DOCUMENTS

| JP | 2001169533 A | 6/2001 |
| JP | 2002064180 A | 2/2002 |
| JP | 2007202237 A | 8/2007 |
| JP | 2008236907 A | 10/2008 |
| JP | 2009044954 A | 2/2009 |
| JP | 2013143138 A | 7/2013 |
| JP | 6187904 B | 8/2017 |

OTHER PUBLICATIONS

Office Action dated Jul. 20, 2021 in corresponding Japanese Patent Application No. 2021-43060 (5 pages) (5 pages Machine English Translation).

* cited by examiner

*Primary Examiner* — Jared Fureman
*Assistant Examiner* — Christopher J Clark

(57) ABSTRACT

A short circuit protection apparatus for a power conversion apparatus supplying power to a load via a plurality of switches connected to each other in parallel includes Ma current detectors each configured to detect a sum of currents flowing through two or more switches among the plurality of switches so as to output a detection signal indicative of the sum that is detected, wherein Ma is 1 less than M, which is the number of the plurality of switches, and a short circuit determiner configured to determine, based on detection signals obtained from the respective Ma current detectors, occurrence of short circuit failure in the plurality of switches to output a cutoff instruction signal for stopping on-off drive of the plurality of switches.

6 Claims, 12 Drawing Sheets

23d

SHORT CIRCUIT PROTECTION APPARATUS FOR POWER CONVERSION APPARATUS

CROSS REFERENCE TO RELATED APPLICATION

This application is based on, and claims priority from, Japanese Patent Application No. 2021-43060, filed Mar. 17, 2021, the entire contents of which is incorporated herein by reference.

BACKGROUND

Technical Field

The disclosure relates to a short circuit protection apparatus for a power conversion apparatus.

Related Art

In a power conversion apparatus that drives a load such as a motor, excessive current may flow through a semiconductor switch in the power conversion apparatus. As a result of such an excessive current flowing for a long period of time, the semiconductor switch may be damaged. Therefore, a short circuit protection apparatus is provided in the power conversion apparatus. The short circuit protection apparatus stops the power conversion apparatus when excessive current is detected flowing through the semiconductor switch.

Japanese Patent Application Laid-Open Publication No. 2008-236907 discloses a technique in which a current detector is provided for each arm that includes a voltage-driven semiconductor element. Each current detector detects an arm current flowing through the corresponding arm. In response to the arm current flowing through the voltage-driven semiconductor element exceeding a predetermined value, short circuit protection is carried out by turning off a gate pulse output from gate driving means.

To increase the capacity of a power conversion apparatus, each arm may include switches connected to each other in parallel. In this case, each switch needs a current detector. This may increase the cost and the size of the short circuit protection apparatus.

SUMMARY

In view of the problems described above, an object of the disclosure is to reduce increase in cost and increase in size of a short circuit protection apparatus, when these increases result from short circuit protection of a power conversion apparatus including a plurality of switches connected to each other in parallel.

In one aspect, a short circuit protection apparatus for a power conversion apparatus is a short circuit protection apparatus for a power conversion apparatus supplying power to a load via a plurality of switches connected to each other in parallel. The short circuit protection apparatus includes Ma current detectors, each configured to detect a sum of currents flowing through two or more switches among the plurality of switches, to output a detection signal indicative of the sum that is detected, in which Ma is 1 less than M, which is a number of the plurality of switches, and a short circuit determiner configured to determine, based on detection signals obtained from the Ma current detectors, occurrence of a short circuit failure in the plurality of switches to output a cutoff instruction signal for stopping on-off drive of the plurality of switches. An N-th current detector among the Ma current detectors is configured to detect a sum of currents flowing through all switches other than an N-th switch from among a first switch to an M-th switch constituting the M switches, as a current detection value, N being an integer from 1 to Ma. The short circuit determiner is configured to: when each and every current detection value detected by the respective Ma current detectors are greater than a threshold, determine occurrence of a short circuit failure in the M-th switch; when a first current detection value detected by a first current detector among the Ma current detectors is less than or equal to the threshold and each of current detection values detected by (Ma−1) second current detectors other than the first current detector is greater than the threshold, in which M is greater than 3, determine occurrence of a short circuit failure in a switch for a current was not detected by the first current detector; and when the first current detection value detected by the first current detector among the Ma current detectors is less than or equal to the threshold and a current detection value detected by an (Ma−1) second current detector other than the first current detector is greater than the threshold and M is equal to 3, determine occurrence of a short circuit failure in a switch for which a current was not detected by the first current detector. In another aspect, a short circuit protection apparatus for a power conversion apparatus supplying power to a load via a plurality of switches connected to each other in parallel includes Ma current detectors each configured to detect a sum of currents flowing through two or more switches among the plurality of switches to output a detection signal indicative of the sum that is detected, in which Ma is 1 less than M, which is a number of the plurality of switches, and a short circuit determiner configured to determine, based on detection signals obtained from the respective Ma current detectors, occurrence of a short circuit failure in the plurality of switches to output a cutoff instruction signal for stopping on-off drive of the plurality of switches. An N-th current detector among the Ma current detectors is configured to detect a sum of currents flowing through respective N-th and (N+1)-th switches from among a first switch to an M-th switch constituting the M switches, as a current detection value, N being an integer from 1 to Ma. The Ma current detectors include a first current detector to an Ma-th current detector. The short circuit determiner is configured to: when a current detection value detected by the first current detector among the Ma current detectors is greater than the threshold and a current detection value detected by a second current detector among the Ma current detectors is less than or equal to the threshold, determine occurrence of a short circuit failure in the first switch; when a current detection value detected by the Ma-th current detector among the Ma current detectors is greater than the threshold and a current detection value detected by an (Ma−1)-th current detector among the Ma current detectors is less than or equal to the threshold, determine occurrence of a short circuit failure in the M-th switch; and when both a current detection value detected by an N-th current detector among the Ma current detectors and a current detection value detected by an (N+1)-th current detector among the Ma current detectors are greater than the threshold, determine that there is occurrence of a short circuit failure in the (N+1)-th switch.

According to the disclosure, the number of current detectors can be less than the number of switches, thereby reducing increase in cost and increase in size of a short circuit protection apparatus, such increases resulting from short circuit protection of a power conversion apparatus including a plurality of switches connected to each other in parallel.

DETAILED DESCRIPTION

An embodiment is described below with reference to the drawings.

Figure 1:
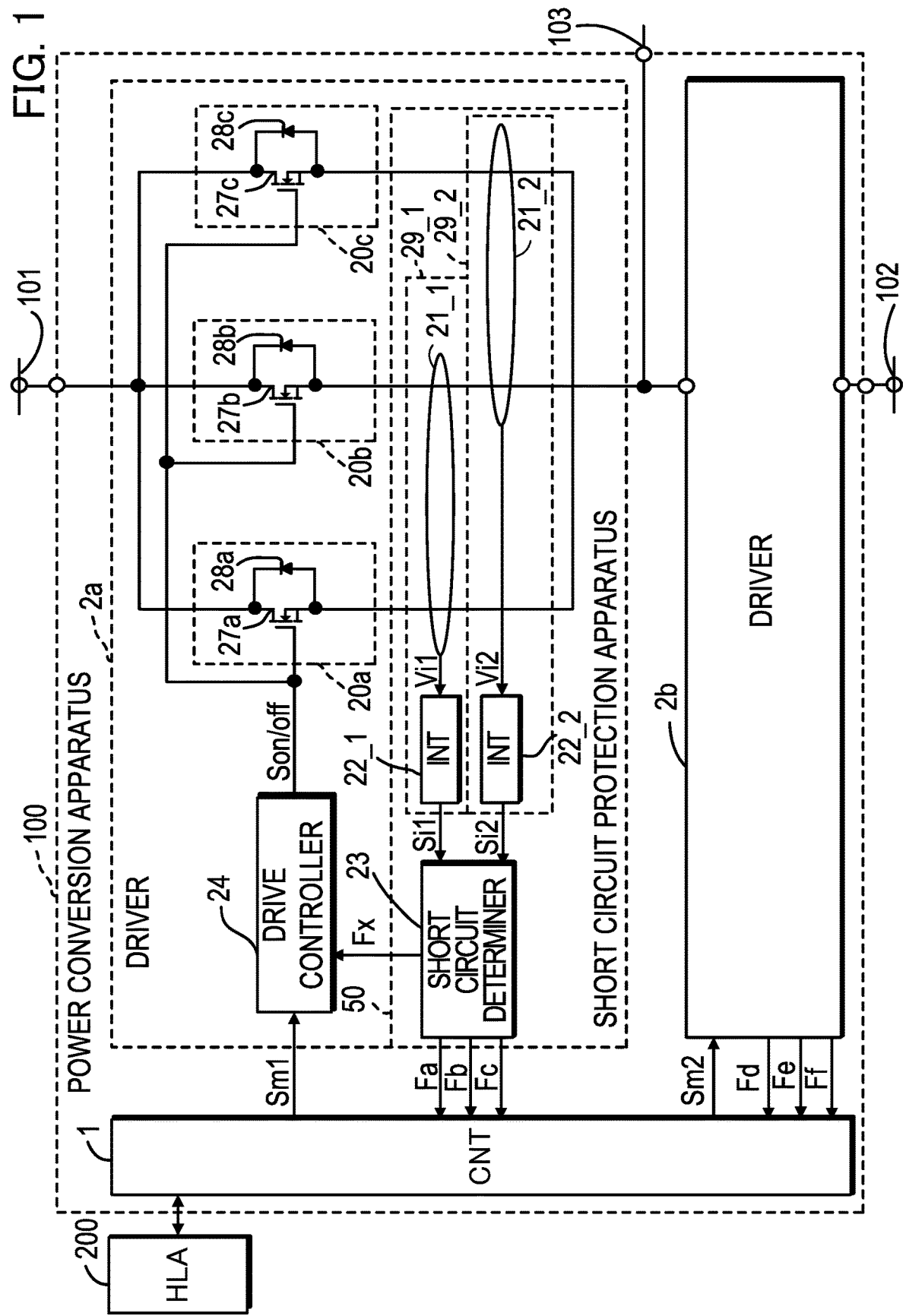
FIG. 1 is a circuit diagram of a configuration of a power conversion apparatus with a short circuit protection apparatus according to an embodiment.

FIG. 1 is a circuit diagram of a configuration of a power conversion apparatus 100 with a short circuit protection apparatus 50 according to the embodiment. The power conversion apparatus 100 includes a controller (CNT) 1 and drivers 2a and 2b. The controller 1 controls elements of the power conversion apparatus 100 in accordance with commands from a higher level apparatus (HLA) 200. The drivers 2a and 2b convert electric power.

In this embodiment, the power conversion apparatus 100 comprises an inverter. FIG. 1 represents the drivers 2a and 2b for one phase in this inverter. The driver 2a is connected between a high potential power line 101 and an output terminal 103. The high potential power line 101 is connected to a positive electrode of a DC power supply. The output terminal 103 is connected to a load. The driver 2b is connected between a low potential power line 102 and the output terminal 103. The low potential power line 102 is connected to a negative electrode of the DC power supply. The power conversion apparatus 100 comprises the inverter in which elements for multiple phases are connected to one another in parallel between the high potential power line 101 and the low potential power line 102. The elements for multiple phases each include the drivers 2a and 2b.

A configuration of the driver 2a is described below. A configuration of the driver 2b is basically the same as that of the driver 2a. Therefore, description of the configuration of the driver 2b is omitted.

The driver 2a includes a plurality of switches 20a, 20b, and 20c connected to each other in parallel, a drive controller 24, and the short circuit protection apparatus 50.

The switches 20a, 20b, and 20c include power switches 27a, 27b, and 27c, respectively. The power switches 27a, 27b, and 27c each comprise a Metal Oxide Semiconductor Field Effect Transistor (MOSFET) including a wide-gap semiconductor such as SiC or GaN. The power switches 27a, 27b, and 27c each include a source (source electrode), a drain (drain electrode), and a gate (control electrode). The drain of the power switch 27a, the drain of the power switch 27b, and the drain of the power switch 27c are connected to the high potential power line 101. The source of the power switch 27a, the source of the power switch 27b, and the source of the power switch 27c are connected to the output terminal 103. The gate of the power switch 27a, the gate of the power switch 27b, and the gate of the power switch 27c are connected to the drive controller 24. The power switches 27a, 27b, and 27c are connected in reverse parallel to diodes 28a, 28b, and 28c, respectively. As in the driver 2a, the driver 2b also includes a plurality of switches connected to each other in parallel. The power conversion apparatus 100 supplies power to the load connected to the output terminal 103 via the plurality of switches connected to each other in parallel in each of the drivers 2a and 2b.

The drive controller 24 outputs, based on a control signal Sm1 supplied from the controller 1, a drive signal Son/off for switching the power switches 27a, 27b, and 27c from the off state to the on state, or from the on state to the off state. The drive controller 24 outputs a drive signal Son/off for turning off the power switches 27a, 27b, and 27c upon receipt of a cutoff instruction signal Fx output from the short circuit protection apparatus 50.

The short circuit protection apparatus 50 detects occurrences of short circuit failures in the plurality of switches 20a, 20b, and 20c connected to each other in parallel, and protects the plurality of switches 20a, 20b, and 20c from short circuit failures. As illustrated in FIG. 1, the short circuit protection apparatus 50 includes current detectors 29_1 and 29_2, and a short circuit determiner 23. The current detector 29_1 includes a Rogowski coil 21_1 and an integrator (INT) 22_1. The current detector 29_2 includes a Rogowski coil 21_2 and an integrator (INT) 22_2. Short circuit failures in the switch 20A and the like may include an incorrect turning on of the power switch 27A and the like, a short circuit failure in the power switch 27A and the like, and a short circuit failure in the diode 28A and the like.

The current detectors 29_1 and 29_2 are Ma current detectors. Ma is a number less than M that is the number of the plurality of switches connected to each other in parallel. Specifically, Ma has the relation Ma=M−1. In this example, M=3 and Ma=2. The current detectors 29_1 and 29_2 are the Ma current detectors that each detect a sum of currents flowing through two or more switches among the plurality of switches to output a detection signal indicative of the sum that is detected (a detection result). The Rogowski coil 21_1 surrounds both a current path connected to the source of the power switch 27a and a current path connected to the source of the power switch 27b. The Rogowski coil 21_2 surrounds both a current path connected to the source of the power switch 27b and a current path connected to the source of the power switch 27c.

An N-th (N is an integer from 1 to Ma) current detector among the Ma current detectors detects a sum of currents flowing through switches other than an N-th switch among the first to M-th switches, as a current detection value.

In this embodiment, the first switch is the switch 20c. The second switch is the switch 20a. The third switch is the switch 20b. The first current detector is the current detector 29_1 or the Rogowski coil 21_1. The second current detector is the current detector 29_2 or the Rogowski coil 21_2.

The first current detector including the Rogowski coil 21_1 detects the sum of respective currents flowing through the respective switches 20a and 20b except the first switch 10c. The Rogowski coil 21_1 outputs a detection signal Vi1, which indicates a detection result of the sum of the current flowing through the switch 20a and the current flowing through the switch 20b, to the integrator 22_1. The detection signal Vi1 indicates a time derivative of the sum of the current flowing through the switch 20a and the current flowing through the switch 20b. By integrating the detection signal Vi1, the integrator 22_1 generates a current detection value Si1 indicative of the sum of the current flowing through the switch 20a and the current flowing through the switch 20b. In other words, the current detector 29_1 detects the sum of the current flowing through the switch 20a and the current flowing through the switch 20b, as the current detection value Si1. The integrator 22_1 outputs the current detection value Si1 to the short circuit determiner 23.

The second current detector including the Rogowski coil 21_2 detects the sum of respective currents flowing through the respective switches 20b and 20c, except for the second switch 20a. The Rogowski coil 21_2 outputs a detection signal Vi2, which indicates a detection result of the sum of the current flowing through the switch 20b and the current flowing through the switch 20c, to the integrator 22_2. The detection signal Vi2 indicates a time derivative of the sum of the current flowing through the switch 20b and the current flowing through the switch 20c. By integrating the detection signal Vi2, the integrator 22_2 generates a current detection value Si2 indicative of the sum of the current flowing through the switch 20b and the current flowing through the switch 20c. In other words, the current detector 29_2 detects the sum of the current flowing through the switch 20b and the current flowing through the switch 20c, as the current detection value Si2. The integrator 22_2 outputs the current detection value Si2 to the short circuit determiner 23.

The short circuit determiner 23 makes a determination concerning a short circuit failure of the switches 20a, 20b, and 20c in accordance with the current detection values Si1 and Si2. The short circuit determiner 23 outputs a short circuit failure signal Fa to the controller 1 in response to a determination that a short circuit failure occurs in the switch 20a. The short circuit determiner 23 outputs a short circuit failure signal Fb to the controller 1 in response to a determination that a short circuit failure has occurred in the switch 20b. The short circuit determiner 23 outputs a short circuit failure signal Fc to the controller 1 in response to a determination that a short circuit failure has occurred in the switch 20c. The controller 1 transmits the short circuit failure signal Fa, Fb, or Fc to the higher level apparatus 200. As a result, the higher level apparatus 200 displays information identifying the switch 20a, 20b, or 20c having the short circuit failure on a display, for example. The short circuit determiner 23 outputs the cutoff instruction signal Fx to the drive controller 24 in response to a determination that a short circuit failure has occurred in any one of the switches 20a, 20b, and 20c. As a result, the drive controller 24 stops on-off drive of the power switches 27a, 27b, and 27c.

Figure 2:
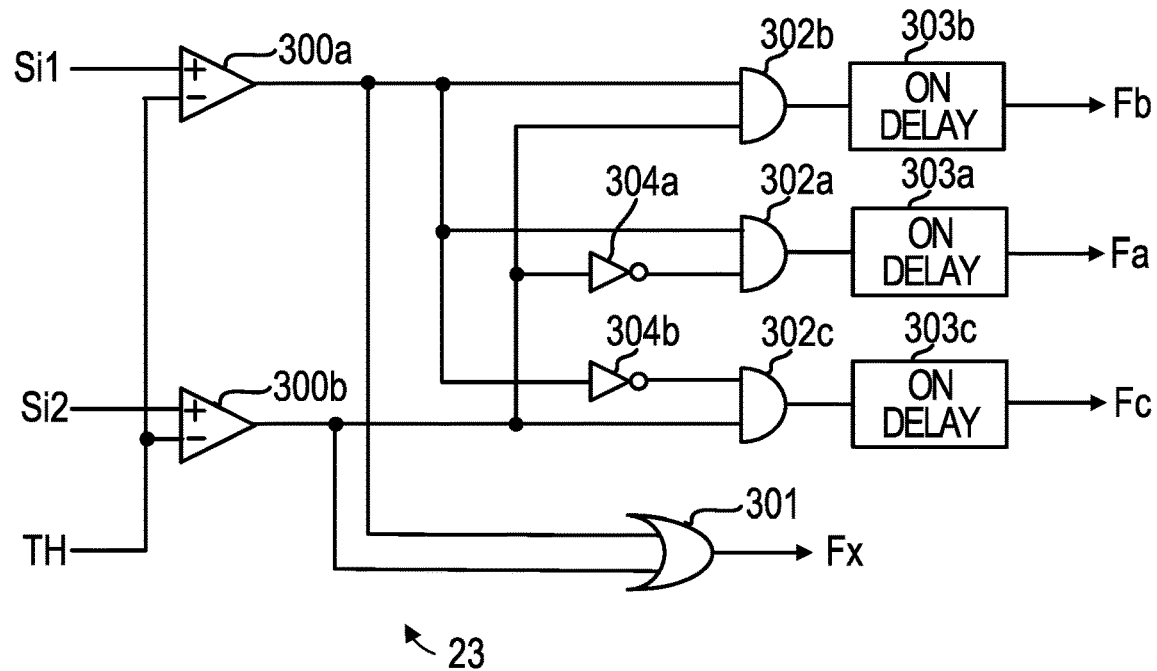
FIG. 2 is a block diagram of an example of a configuration of a short circuit determiner in the short circuit protection apparatus.

FIG. 2 is a block diagram of an example of a configuration of the short circuit determiner 23. As illustrated in FIG. 2, the short circuit determiner 23 includes comparators 300a and 300b, an OR operator 301, AND operators 302a, 302b, and 302c, on-delay operators 303a, 303b, and 303c, and NOT operators 304a and 304b. The on-delay operator 303a is an operator that delays a change in an input signal input to the on-delay operator 303a from an inactive level to an active level by a predetermined time and outputs the delayed change. The on-delay operator 303b is an operator that delays the change in an input signal input to the on-delay operator 303b from an inactive level to an active level by a predetermined time and outputs the delayed change. The on-delay operator 303c is an operator that delays the change in an input signal input to the on-delay operator 303c from an inactive level to an active level by a predetermined time and outputs the delayed change. Each of the on-delay operators 303a, 303b, and 303c stabilizes operations of the short circuit determiner 23.

The comparator 300a sets the level of an output signal output from the comparator 300a to an inactive level in response to the current detection value Si1, which indicates the sum of the current flowing through the switch 20a and the current flowing through the switch 20b, being less than or equal to a short-circuit-current-determination threshold TH. The comparator 300a sets the level of the output signal output from the comparator 300a to an active level in response to the current detection value Si1 being greater than the short-circuit-current-determination threshold TH. The comparator 300b sets the level of an output signal output from the comparator 300b to an inactive level in response to the current detection value Si2, which indicates the sum of the current flowing through the switch 20b and the current flowing through the switch 20c, being less than or equal to the short-circuit-current-determination threshold TH. The comparator 300b sets the level of the output signal output from the comparator 300b to an active level in response to the current detection value Si2 being greater than the short-circuit-current-determination threshold TH. In this case, the short-circuit-current-determination threshold TH is set to, for example, 300% of the rated power switch current.

When at least one of the respective output signals from the comparators 300a and 300b is active, the OR operator 301 determines that a short circuit failure has occurred in any of the switches 20a, 20b, and 20c. In other words, when at least one of the sum of the current flowing through the switch 20a and the current flowing through the switch 20b or the sum of the current flowing through the switch 20b and the current flowing through the switch 20c is greater than the shortcircuit-current-determination threshold TH, the OR operator 301 determines that a short circuit failure has occurred in any of the switches 20*a*, 20*b*, and 20*c*. The OR operator 301 outputs the cutoff instruction signal Fx to the drive controller 24 in response to a determination that a short circuit failure has occurred in any of the switches 20*a*, 20*b*, and 20*c*.

When the output signal of the comparator 300*a* is active and the output signal of the comparator 300*b* is active, the AND operator 302*b* determines that a short circuit failure occurs in the switch 20*b*. That is, when the sum of the current flowing through the switch 20*a* and the current flowing through the switch 20*b* is greater than the short-circuit-current-determination threshold TH and the sum of the current flowing through the switch 20*b* and the current flowing through the switch 20*c* is greater than the short-circuit-current-determination threshold TH, the AND operator 302*b* determines that a short circuit failure occurs in the switch 20*b*. The AND operator 302*b* outputs the short circuit failure signal Fb to the controller 1 via the on-delay operator 303*b* in response to a determination that a short circuit failure occurs in the switch 20*b*. In this manner, the AND operator 302*b* determines that a short circuit failure has occurred in the M-th switch (in this example, the switch 20*b*) when each of the current detection values detected by the Ma current detectors (in this example, the current detection values Si1 and Si2 obtained by integrating the signals from the Rogowski coils 21_1 and 21_2) is greater than the threshold TH.

When the output signal of the comparator 300*a* is active and a signal obtained by inverting the output signal of the comparator 300*b* in the NOT operator 304*a* is active, the AND operator 302*a* determines that a short circuit failure has occurred in the switch 20*a*. In other words, when the sum of the current flowing through the switch 20*a* and the current flowing through the switch 20*b* is greater than the short-circuit-current-determination threshold TH and the sum of the current flowing through the switch 20*b* and the current flowing through the switch 20*c* is less than or equal to the short-circuit-current-determination threshold TH, the AND operator 302*a* determines that a short circuit failure has occurred in the switch 20*a*. The AND operator 302*a* outputs the short circuit failure signal Fa to the controller 1 via the on-delay operator 303*a* in response to a determination that a short circuit failure has occurred in the switch 20*a*. Thus, when a current detection value (in this example, the current detection value Si2 obtained by integrating the signal from the Rogowski coil 21_2) detected by one current detector among the Ma current detectors is less than or equal to the threshold TH and a current detection value detected by the other (Ma−1) current detector (in this example, the current detection value Si1 obtained by integrating the signal from the Rogowski coil 21_1) is greater than the threshold TH, the AND operator 302*a* determines that a short circuit failure has occurred in a switch for which a current was not detected by the one current detector (in this example, the switch 20*a*).

When a signal obtained by inverting the output signal of the comparator 300*a* in the NOT operator 304*b* is active and the output signal of the comparator 300*b* is active, the AND operator 302*c* determines that a short circuit failure has occurred in the switch 20*c*. In other words, when the sum of the current flowing through the switch 20*a* and the current flowing through the switch 20*b* is less than or equal to the short-circuit-current-determination threshold TH and the sum of the current flowing through the switch 20*b* and the current flowing through the switch 20*c* is greater than the short-circuit-current-determination threshold TH, the AND operator 302*c* determines that a short circuit failure occurs in the switch 20*c*. The AND operator 302*c* outputs the short circuit failure signal Fc to the controller 1 via the on-delay operator 303*c* in response to a determination that the short circuit failure has occurred in the switch 20*c*. Thus, when a current detection value (in this example, the current detection value Si1 obtained by integrating the signal from the Rogowski coil 21_1) detected by one current detector among the Ma current detectors is less than or equal to the threshold TH and the current detection value (in this example, the current detection value Si2 obtained by integrating the signal from the Rogowski coil 21_2) detected by the other (Ma−1) current detector is greater than the threshold TH, the AND operator 302*c* determines occurrence of a short circuit failure in a switch for which a current was not detected by the one current detector (in this example, the switch 20*c*).

Figure 3:
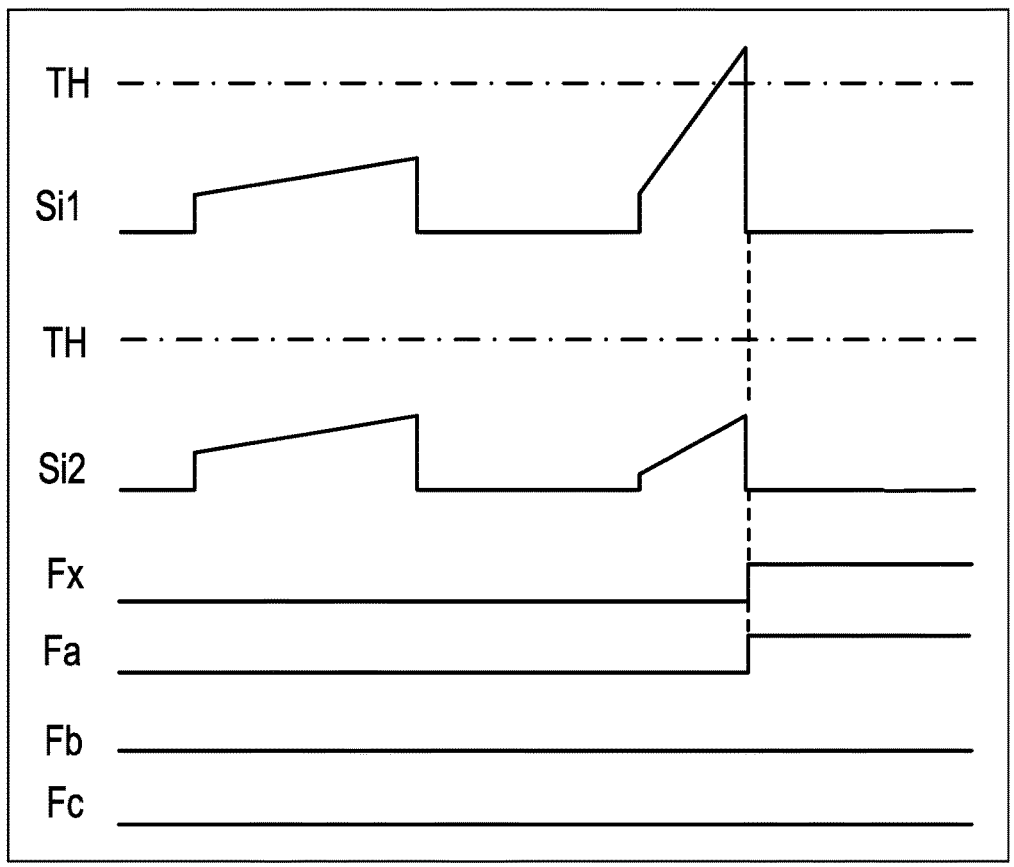
FIG. 3 is a waveform diagram of an example of an operation of the embodiment.
Figure 4:
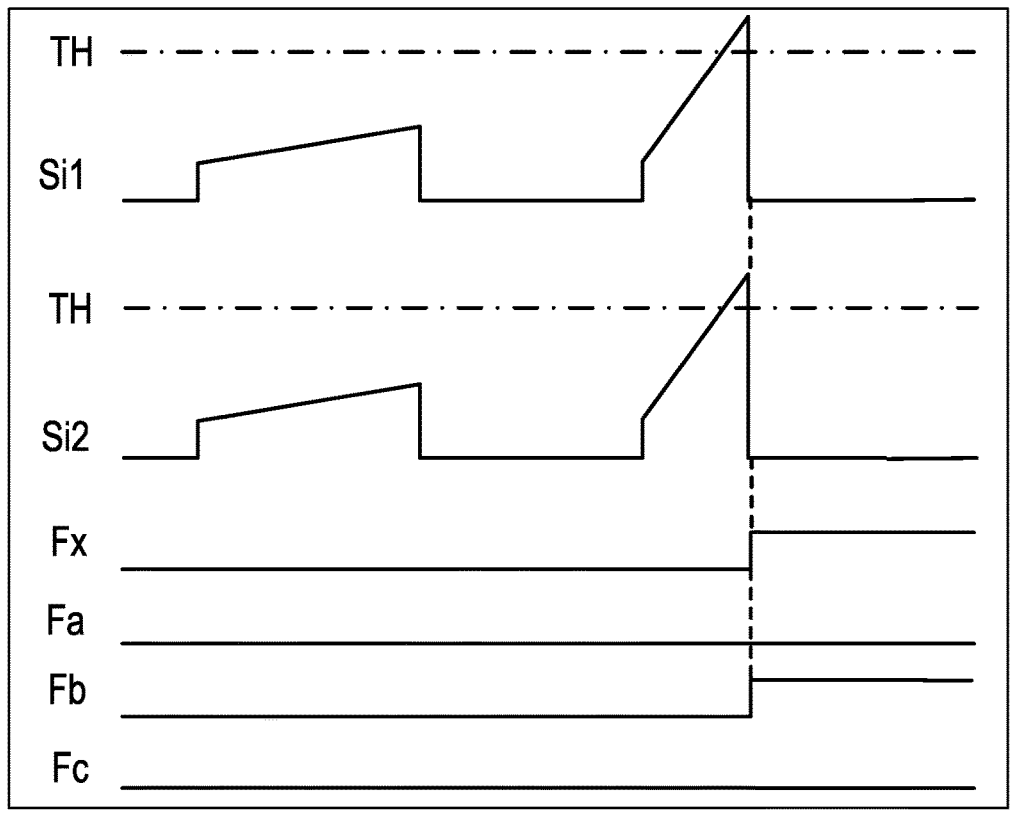
FIG. 4 is a waveform diagram of an example of another operation of the embodiment.
Figure 5:
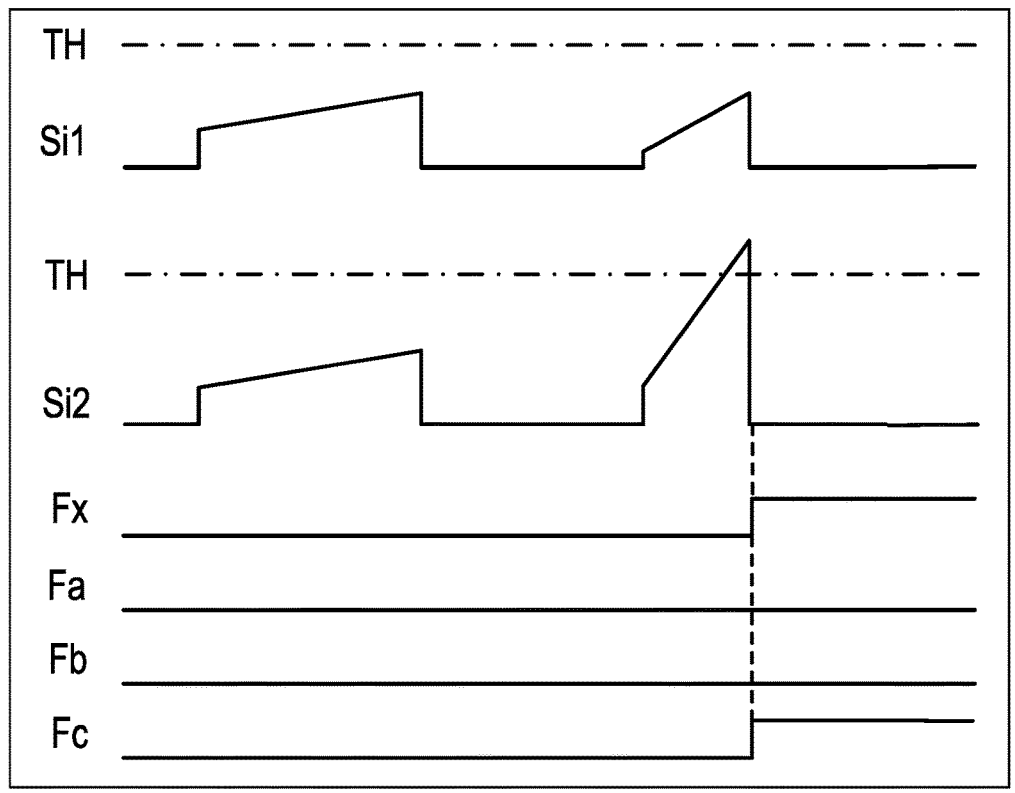
FIG. 5 is a waveform diagram of an example of yet another operation of the embodiment.

FIG. 3 to FIG. 5 are waveform diagrams of examples of the operations of short circuit failure detection in this embodiment. The operations of this embodiment are described below with reference to these drawings.

In an example of the operation illustrated in FIG. 3, a short circuit failure has occurred in the switch 20*a*. In a normal state before this short circuit failure occurs, the current detection value Si1 indicative of the sum of the current flowing through the switch 20*a* and the current flowing through the switch 20*b* is less than the short-circuit-current-determination threshold TH. The current detection value Si2 indicative of the sum of the current flowing through the switch 20*b* and the current flowing through the switch 20*c* is also less than the short-circuit-current-determination threshold TH.

In response to occurrence of a short circuit failure in the switch 20*a*, the current flowing through the switch 20*a* becomes greater than the current flowing through the switch 20*a* in the normal state. In this case, the current detection value Si1 indicative of the sum of the current flowing through the switch 20*a* and the current flowing through the switch 20*b* becomes greater than the short-circuit-current-determination threshold TH. The current detection value Si2 indicative of the sum of the current flowing through the switch 20*b* and the current flowing through the switch 20*c* is less than or equal to the short-circuit-current-determination threshold TH. Therefore, both the cutoff instruction signal Fx and the short circuit failure signal Fa which specifies the switch 20*a* as the point of occurrence of a short circuit failure, become active.

In an example of the operation illustrated in FIG. 4, a short circuit failure occurs in the switch 20*b*. The operation in the normal state before the occurrence of this short circuit failure is the same as the example of the operation in FIG. 3.

In response to occurrence of a short circuit failure in the switch 20*b*, the current flowing through the switch 20*b* becomes greater than the current flowing through the switch 20*b* in the normal state. In this case, the current detection value Si1 indicative of the sum of the current flowing through the switch 20*a* and the current flowing through the switch 20*b* becomes greater than the short-circuit-current-determination threshold TH. In addition, the current detection value Si2 indicative of the sum of the current flowing through the switch 20*b* and the current flowing through the switch 20*c* becomes also greater than the short-circuit-current-determination threshold TH. Therefore, both cutoff instruction signal Fx and the short circuit failure signal Fb which specifies the switch 20*b* as the point of occurrence of an short-circuit failure, become active.

In an example of the operation illustrated in FIG. 5, a short circuit failure occurs in the switch 20c. The operation in the normal state before the occurrence of this short circuit failure is the same as the example of the operation in FIG. 3.

In response to occurrence of a short circuit failure in the switch 20c, the current flowing through the switch 20c becomes greater than the current flowing through the switch 20c in the normal state. In this case, the current detection value Si1 indicative of the sum of the current flowing through the switch 20a and the current flowing through the switch 20b is less than or equal to the short-circuit-current-determination threshold TH. The current detection value Si2 indicative of the sum of the current flowing through the switch 20b and the current flowing through the switch 20c becomes greater than the short-circuit-current-determination threshold TH. Therefore, both the cutoff instruction signal Fx and the short circuit failure signal Fc which specifies the switch 20c as the point of occurrence of a short circuit failure become active.

According to the embodiment, it is possible to detect a short circuit failure in any one of the switches 20a, 20b, and 20c to stop the drive of the switches 20a, 20b, and 20c, and to identify the switch having a short circuit failure by using the two Rogowski coils 21_1 and 21_2 that are one fewer than the three switches 20a, 20b, and 20c that are connected to each other in parallel. Therefore, it is possible to reduce increase in cost and increase in size of a short circuit protection apparatus, such increases resulting from short circuit protection of a power conversion apparatus including a plurality of switches connected to each other in parallel. In the embodiment, the two Rogowski coils 21_1 and 21_2 both detect the sum of the respective currents flowing through the respective two switches. Therefore, the current detection accuracy by one Rogowski coil can be equal to the current detection accuracy by the other Rogowski coil, thereby determining a short circuit failure in each switch accurately.

Figure 6:
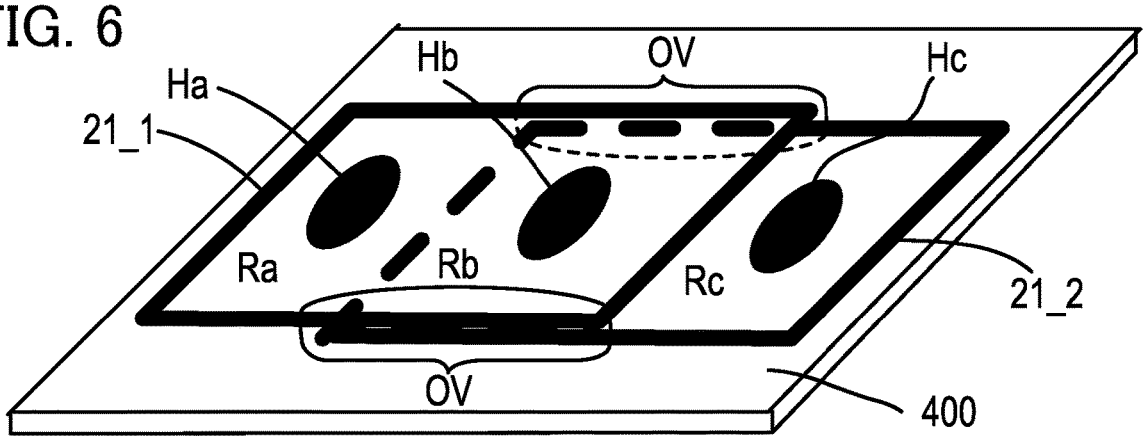
FIG. 6 is a perspective view of an implementation example of two Rogowski coils in the short circuit protection apparatus.

Examples of the Rogowski coils in this embodiment will be described. FIG. 6 is a perspective view of examples of the Rogowski coils 21_1 and 21_2 provided in a board 400. In this example, the Rogowski coils 21_1 and 21_2 are provided on the board 400 in a state in which the Rogowski coils 21_1 and 21_2 overlap in an overlap portion OV.

In the board 400, a through hole Ha is open in a region Ra surrounded by the Rogowski coil 21_1 not surrounded by the Rogowski coil 21_2. A current path for the current flowing through the switch 20a is inserted into the through hole Ha. In the board 400, a through hole Hb is open in a region Rb surrounded by both of the Rogowski coils 21_1 and 21_2, that is, the region Rb includes the overlap portion OV. A current path for the current flowing through the switch 20b is inserted into the through hole Hb. In the board 400, a through hole Hc is open in a region Rc surrounded by the Rogowski coil 21_2 not surrounded by the Rogowski coil 21_1. A current path for the current flowing through the switch 20c is inserted into the through hole Hc. In this case, the Rogowski coil 21_1 and the Rogowski coil 21_2 overlap near the switch 20b.

The Rogowski coil 21_1 surrounds the through holes Ha and Hb. The Rogowski coil 21_1 detects the sum of the current flowing through the current path inserted into the through hole Ha and the current flowing through the current path inserted into the through hole Hb. The current flowing through the current path inserted into the through hole Ha is the current flowing through the switch 20a. The current flowing through the current path inserted in the through hole Hb is the current flowing through the switch 20b. The Rogowski coil 21_2 surrounds the through holes Hb and Hc. The Rogowski coil 21_2 detects the sum of the current flowing through the current path inserted into the through hole Hb and the current flowing through the current path inserted into the through hole Hc. The current flowing through the current path inserted into the through hole Hb is the current flowing through the switch 20b. The current flowing through the current path inserted into the through hole Hc is the current flowing through the switch 20c.

Figure 7:
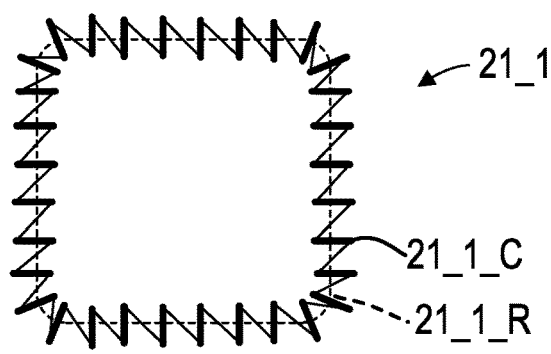
FIG. 7 is a plan view of an example of a configuration of a Rogowski coil.

FIG. 7 is a plan view illustrating the Rogowski coil 21_1. As illustrated in FIG. 7, the Rogowski coil 21_1 includes a coil 21_1_C and a return line 21_1_R. The coil 21_1_C extends in a spiral shape. The return line 21_1_R extends in the coil 21_1_C from an end point of the coil 21_1_C back to a start point of the coil 21_1_C. Although not shown in the drawings, a configuration of the Rogowski coil 21_2 is the same as a configuration of the Rogowski coil 21_1.

Figure 8:
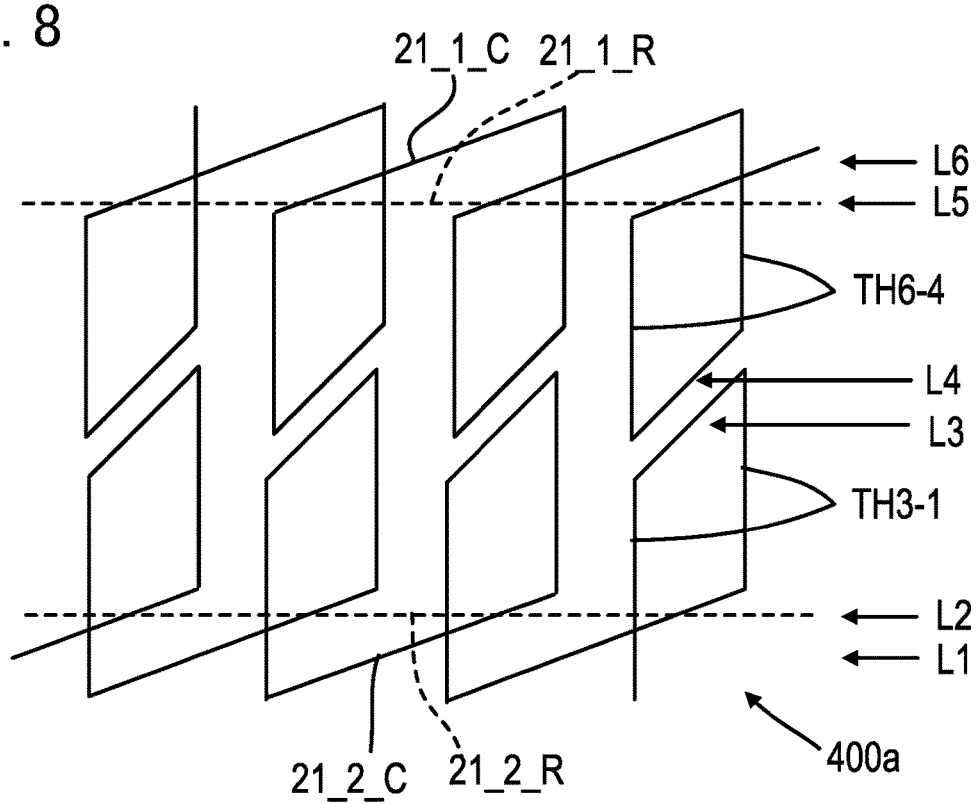
FIG. 8 is a perspective view of a first implementation example of overlap between the two Rogowski coils.

FIG. 8 is a perspective view of a first implementation example of the Rogowski coils 21_1 and 21_2 in the overlap portion OV in FIG. 6. In FIG. 8, the Rogowski coil 21_1 and the Rogowski coil 21_2 are provided in a multilayer printed circuit board 400a.

On a first layer L1 of the multilayer printed circuit board 400a, a lower horizontal portion of a coil 21_2_C of the Rogowski coil 21_2 is formed. On a second layer L2 above the first layer L1, a return line 21_2_R of the Rogowski coil 21_2 is formed. On a third layer L3 above the second layer L2, an upper horizontal portion of the coil 21_2_C of the Rogowski coil 21_2 is formed. A vertical portion of the coil 21_2_C is formed by using a through hole TH3-1 connecting the third layer L3 with the first layer L1. The vertical portion of the coil 21_2_C connects the upper horizontal portion of the coil 21_2_C with the lower horizontal portion of the coil 21_2_C.

On a fourth layer L4 above the third layer L3, a lower horizontal portion of the coil 21_1_C of the Rogowski coil 21_1 is formed. On a fifth layer L5 above the fourth layer L4, the return line 21_1_R of the Rogowski coil 21_1 is formed. On a sixth layer L6 above the fifth layer L5, an upper horizontal portion of the coil 21_1_C of the Rogowski coil 21_1 is formed. A vertical portion of the coil 21_1_C is formed by using a through hole TH6-4 connecting the sixth layer L6 with the fourth layer L4. The vertical portion of the coil 21_1_C connects the upper horizontal portion of the coil 21_1_C with the lower horizontal portion of the coil 21_1_C.

In the example illustrated in FIG. 8, both the length from the second layer L2 to the third layer L3 and the length from the fourth layer L4 to the fifth layer L5 are greater than the length between two other layers next to each other. Therefore, the return line 21_1_R of the Rogowski coil 21_1 is farther from the Rogowski coil 21_2. The return line 21_2_R of the Rogowski coil 21_2 is farther from the Rogowski coil 21_1. Specifically, the return line 21_1_R of the Rogowski coil 21_1 is farther from the Rogowski coil 21_2 (the return line 21_2_R of the Rogowski coil 21_2) than from the central axis of the Rogowski coil 21_1. The return line 21_2_R of the Rogowski coil 21_2 is farther from the Rogowski coil 21_1 (the return line 21_1_R of the Rogowski coil 21_1) than from the central axis of the Rogowski coil 21_2. The Rogowski coil 21_1 is an example of a first Rogowski coil. The Rogowski coil 21_2 is an example of a second Rogowski coil. The Rogowski coil 21_1 is another example of the second Rogowski coil. The Rogowski coil 21_2 is another example of the first Rogowski coil.

In the first implementation example, the return line 21_1_R of the Rogowski coil 21_1 and the return line 21_2_R of the Rogowski coil 21_2 extend parallel to each other along the direction of the length of the overlap portion OV. Therefore, when the return lines 21_1_R and 21_2_R are close to each other, problems can arise in measuring currents. For example, when a first magnetic field occurs around the return line 21_1_R due to a current flowing through the return line 21_1_R in a situation in which the return lines 21_1_R and 21_2_R are close to each other, an induced current that generates a second magnetic field cancelling the first magnetic field flows through the return line 21_2_R. In the first implementation example, the return lines 21_1_R and 21_2_R are far from each other. Therefore, the return line 21_2_R is not easily affected by the current flowing through the return line 21_1_R. Consequently, highly accurate current measurement can be executed by using the Rogowski coils 21_1 and 21_2.

Figure 9:
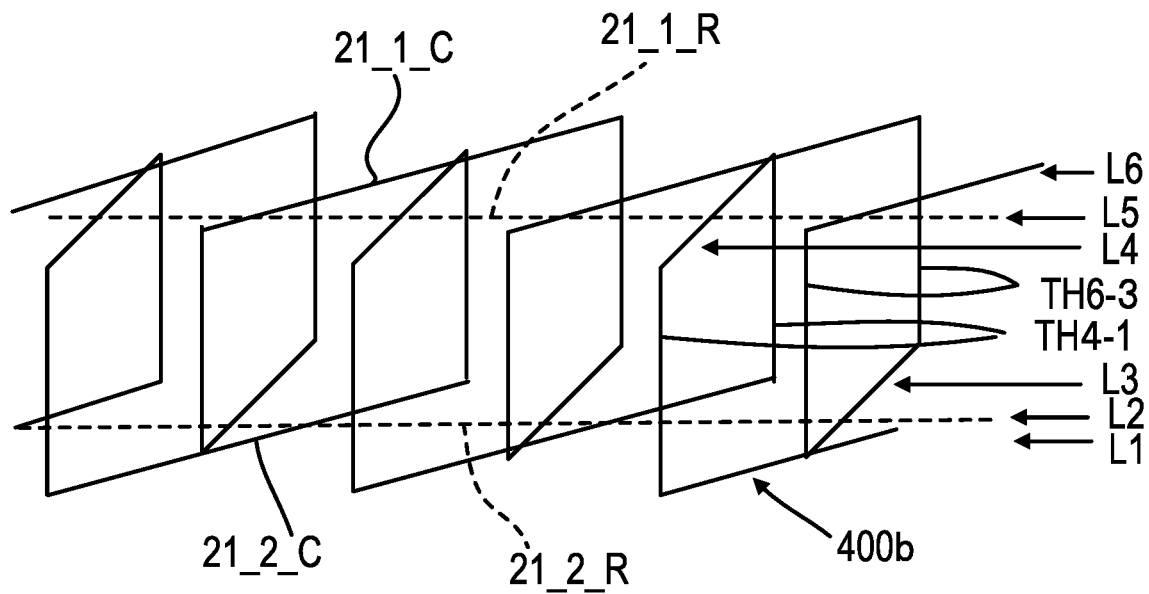
FIG. 9 is a perspective view of a second implementation example of overlap between the two Rogowski coils.
Figure 10:
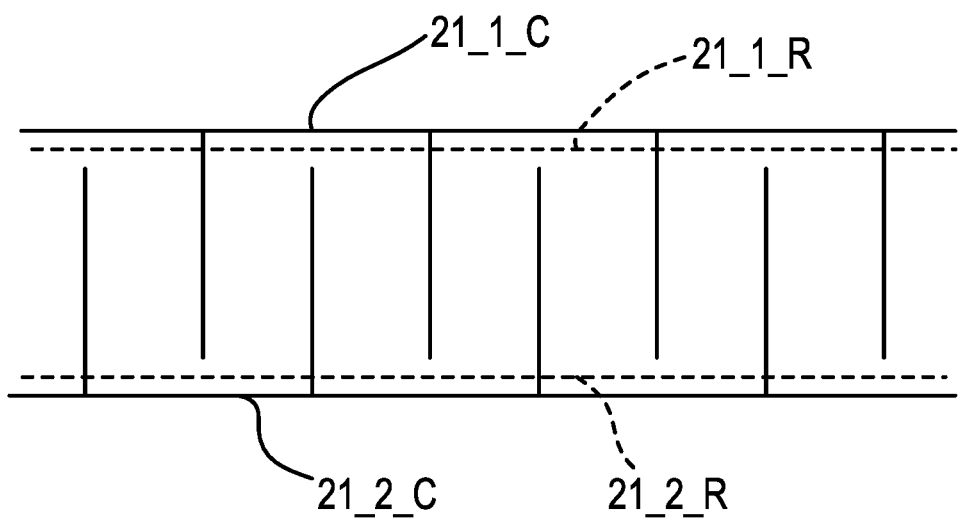
FIG. 10 is a side view of the second implementation example.

FIG. 9 is a perspective view of a second implementation example of the Rogowski coils 21_1 and 21_2 in the overlap portion OV in FIG. 6. FIG. 10 is a side view of the second implementation example. In the second implementation example, the Rogowski coil 21_1 and the Rogowski coil 21_2 are provided in a multilayer printed circuit board 400b.

In the second implementation example illustrated in FIG. 10, the coil 21_1_C of the Rogowski coil 21_1 and the coil 21_2_C of the Rogowski coil 21_2 are arranged alternately in a direction (the horizontal direction in FIG. 10) along the axis of each coil (or each return line) in the overlap portion OV between the Rogowski coil 21_1 and the Rogowski coil 21_2. Details of the second implementation example are as follows.

In FIG. 9, the lower horizontal portion of the coil 21_2_C of the Rogowski coil 21_2 is formed on a first layer L1 of the multilayer printed circuit board 400b. On a second layer L2 above the first layer L1, the return line 21_2_R of the Rogowski coil 21_2 is formed. On a third layer L3 above the second layer L2, the lower horizontal portion of the coil 21_1_C of the Rogowski coil 21_1 is formed. On a fourth layer L4 above the third layer L3, the upper horizontal portion of the coil 21_2_C of the Rogowski coil 21_2 is formed. The vertical portion of the coil 21_2_C is formed by using a through hole TH4-1 connecting the fourth layer L4 with the first layer L1. The vertical portion of the coil 21_2_C connects the upper horizontal portion of the coil 21_2_C with the lower horizontal portion of the coil 21_2_C.

On a fifth layer L5 above the fourth layer L4, the return line 21_1_R of the Rogowski coil 21_1 is formed. On a sixth layer L6 above the fifth layer L5, the upper horizontal portion of the coil 21_1_C of the Rogowski coil 21_1 is formed. The vertical portion of the coil 21_1_C is formed by using a through hole TH6-3 connecting the sixth layer L6 with the third layer L3. The vertical portion of the coil 21_1_C connects the upper horizontal portion of the coil 21_1_C with the lower horizontal portion of the coil 21_1_C.

In the second implementation example, the return line 21_1_R of the Rogowski coil 21_1 formed on the fifth layer L5 and the return line 21_2_R of the Rogowski coil 21_2 formed on the second layer L2 are farther from each other. Specifically, the return line 21_1_R of the Rogowski coil 21_1 is farther from the return line 21_2_R of the Rogowski coil 21_2 than from the central axis of the Rogowski coil 21_1. The return line 21_2_R of the Rogowski coil 21_2 is farther from the return line 21_1_R of the Rogowski coil 21_1 than from the central axis of the Rogowski coil 21_2. Accordingly, as in the first implementation example, highly accurate current measurement can be executed by using the Rogowski coils 21_1 and 21_2.

In the second implementation example, the coil 21_1_C of the Rogowski coil 21_1 and the coil 21_2_C of the Rogowski coil 21_2 are arranged alternatingly. Therefore, it is possible to reduce the thickness of the multilayer printed circuit board 400b in which the Rogowski coils are provided, thereby reducing the cost and size of the board.

MODIFICATIONS

Modifications will be described below. One or more modifications freely selected from the following modifications may be combined with the embodiment as long as no conflict occurs.

(1) First Modification

Figure 11:
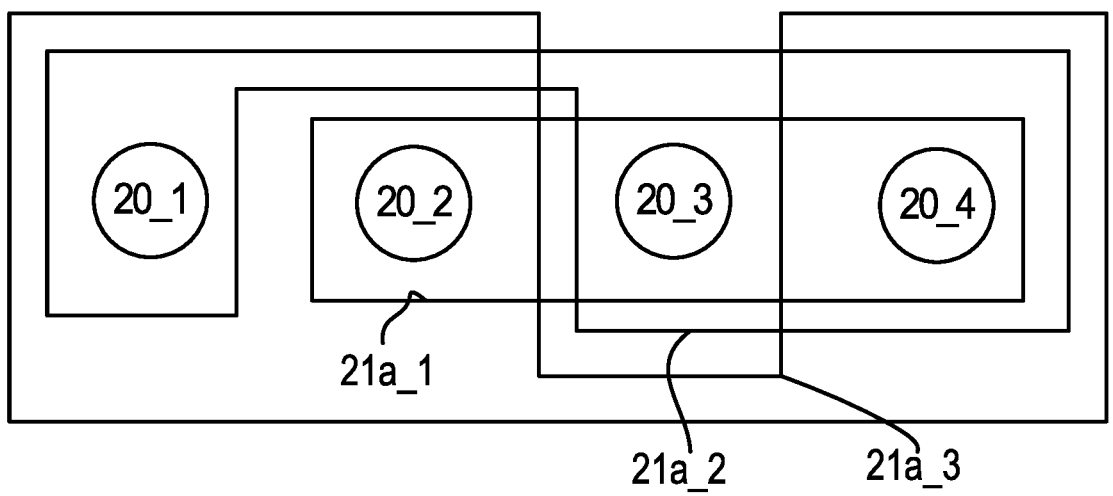
FIG. 11 is a diagram of an implementation example of Rogowski coils according to a first modification.

In the above embodiment, the number of the switches connected to each other in parallel is three. The disclosure can be applied to a power conversion apparatus including four or more switches connected to each other in parallel. FIG. 11 is a diagram of an implementation example of Rogowski coils in a power conversion apparatus including four switches 20_1, 21_2, 20_3, and 20_4 connected to each other in parallel.

In the first modification, M=4 and Ma=3. The switch 20_1 is the first switch. The switch 20_2 is the second switch. The switch 20_3 is the third switch. The switch 20_4 is the fourth switch. The N-th (N=1 to Ma) current detector detects the sum of respective currents flowing through the other respective switches except the N-th switch. Specifically, the first current detector including a Rogowski coil 21a_1 detects the sum of the respective currents flowing through the respective switches 20_2, 20_3, and 20_4 except for the first switch 20_1. The second current detector including a Rogowski coil 21a_2 detects the sum of the respective currents flowing through the respective switches 20_1, 20_3, and 20_4 except for the second switch 20_2. The third current detector including a Rogowski coil 21a_3 detects the sum of the respective currents flowing through the respective switches 20_1, 20_2, and 20_4 except for the third switch 20_3.

Figure 12:
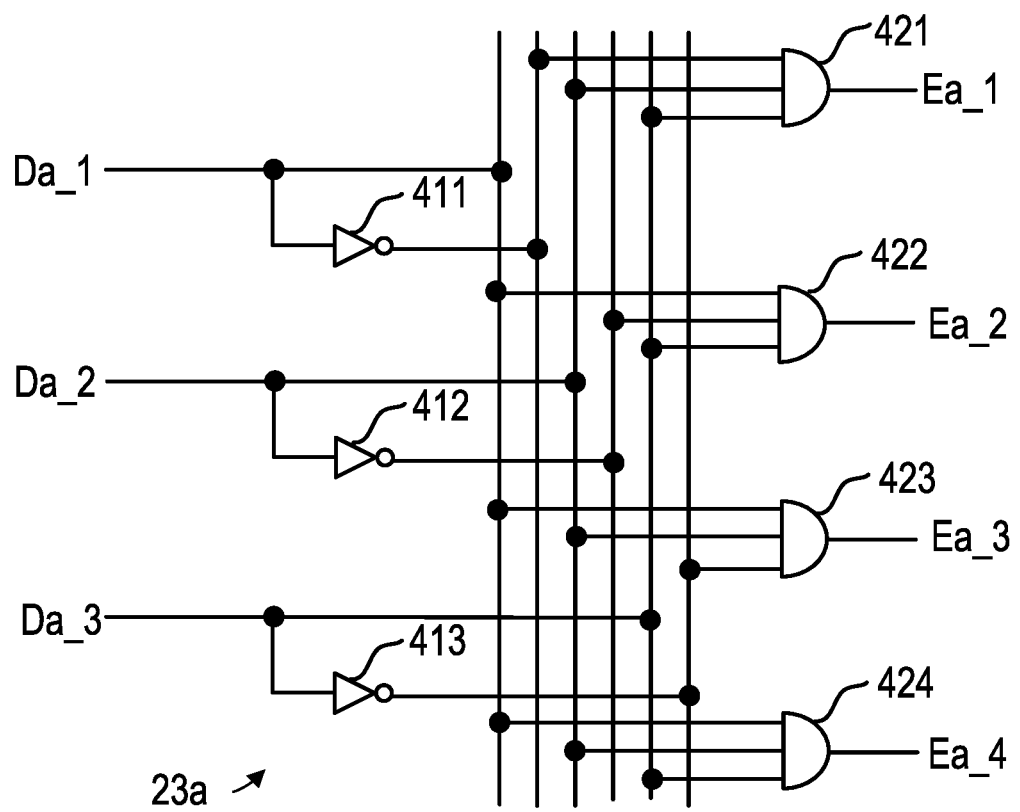
FIG. 12 is a block diagram of a configuration of a short circuit determiner corresponding to the Rogowski coils in FIG. 11.

FIG. 12 is a block diagram of a configuration of a short circuit determiner 23a in the first modification. In FIG. 12, elements corresponding to the comparators 300a and 300b, and elements corresponding to the on-delay operators 303a to 303c in FIG. 2 are omitted.

In FIG. 12, a signal Da_1 is active when a current detection value obtained by integrating the signal from the Rogowski coil 21a_1 is greater than the threshold TH. The signal Da_1 is inactive when the current detection value obtained by integrating the signal from the Rogowski coil 21a_1 is less than or equal to the threshold TH. A signal Da_2 is active when a current detection value obtained by integrating the signal from the Rogowski coil 21a_2 is greater than the threshold TH. The signal Da_2 is inactive when the current detection value obtained by integrating the signal from the Rogowski coil 21a_2 is less than or equal to the threshold TH. A signal Da_3 is active when a current detection value obtained by integrating the signal from the Rogowski coil 21a_3 is greater than the threshold TH. The signal Da_3 is inactive when the current detection value obtained by integrating the signal from the Rogowski coil 21a_3 is less than or equal to the threshold TH.

When each and every current detection value detected by the respective Ma current detectors is greater than the threshold TH, the short circuit determiner 23a determines that a short circuit failure has occurred in the M-th switch. Specifically, when each and every current detection value obtained by integrating the respective signals from the Rogowski coils 21a_1, 21a_2, and 21a_3 is greater than the threshold TH, and all of the signals Da_1, Da_2, and Da_3 are active, an AND operator 424 in the short circuit determiner 23a sets a signal Ea_4 to active. The signal Ea_4 is a signal specifying the switch 20-4 that is the M-th switch as the point of occurrence of a short circuit failure. The signal Ea_4 is output as a short circuit failure signal through an on-delay operator (not shown in the drawings). Signals Ea_1 to Ea_3 change in a similar way to the signal Ea_4.

When a current detection value detected by one current detector among the Ma current detectors is less than or equal to the threshold TH and all current detection values detected by the (Ma−1) current detectors that are all current detectors other than the one current detector among the Ma current detectors are greater than the threshold TH, the short circuit determiner 23a determines there has been occurrence of a short circuit failure in a switch for which a current was not detected by the one current detector.

For example, when the current detection value obtained by integrating the signal from the Rogowski coil 21a_1 is less than or equal to the threshold TH and all of the current detection values obtained by integrating the signals from the Rogowski coils 21a_2 and 21a_3 are greater than the threshold TH, a signal obtained by inverting the signal Da_1 in a NOT operator 411, and the signals Da_2 and Da_3 are active. In this case, an AND operator 421 sets the signal Ea_1 to active. The signal Ea_1 is a signal identifying the switch 20_1 through which a current not detected by the Rogowski coil 21a_1 flows, as the point of occurrence of a short circuit failure.

When the current detection value obtained by integrating the signal from the Rogowski coil 21a_2 is less than or equal to the threshold TH and all of the current detection values obtained by integrating the signals from the Rogowski coils 21a_1 and 21a_3 are greater than the threshold TH, a signal obtained by inverting the signal Da_2 in a NOT operator 412, and the signals Da_1 and Da_3 are active. In this case, an AND operator 422 sets the signal Ea_2 to active. The signal Ea_2 is a signal identifying the switch 20_2 for which a current was not detected by the Rogowski coil 21a_2, as the point of occurrence of a short circuit failure.

When the current detection value obtained by integrating the signal from the Rogowski coil 21a_3 is less than or equal to the threshold TH and all of the current detection values obtained by integrating the signals from the Rogowski coils 21a_1 and 21a_2 are greater than the threshold TH, a signal obtained by inverting the signal Da_3 in a NOT operator 413, and the signals Da_1 and Da_2 are active. In this case, an AND operator 423 sets a signal Ea_3 to active. The signal Ea_3 is a signal identifying the switch 20_3 for which a current was not detected by the Rogowski coil 21a_3, as the point of occurrence of a short circuit failure.

(2) Second Modification

In the above embodiment, when the number of the switches connected to each other in parallel is M, the Ma (where, Ma=M−1) current detectors each detect the sum of the respective currents flowing through the Ma switches. Each of the Ma current detectors may detect the sum of the respective currents flowing through respective two switches.

Figure 13:
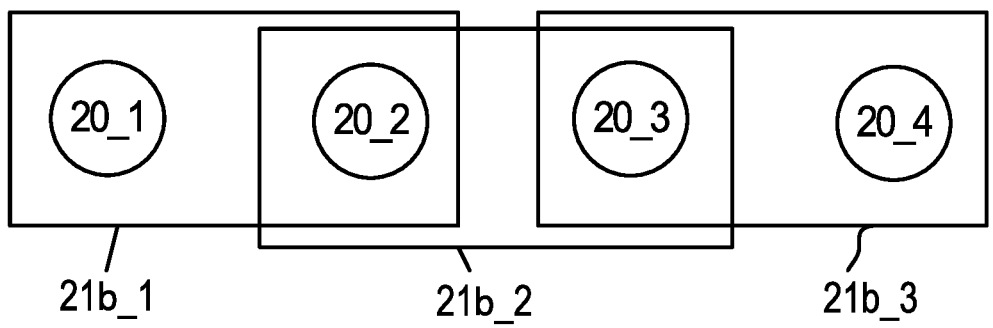
FIG. 13 is a diagram of an implementation example of Rogowski coils according to a second modification.

FIG. 13 is a diagram of an implementation example of the Rogowski coils when M=4 and Ma=3 in the second modification. In the second modification, the N-th current detector among the Ma current detectors detects the sum of respective currents flowing through the respective N-th and (N+1)-th switches among the M switches from the first switch to the M-th switch, as the current detection value. Here, N is an integer from 1 to Ma.

Specifically, in FIG. 13, the switches 20_1 to 20_4 are the first to fourth (M-th) switches, respectively. Rogowski coils 21b_1 to 21b_3 are included in the first to third (Ma-th) current detectors, respectively.

As illustrated in FIG. 13, the first current detector including the Rogowski coil 21b_1 detects the sum of the current flowing through the first switch 20_1 and the current flowing through the second switch 20_2. The second current detector including the Rogowski coil 21b_2 detects the sum of the current flowing through the second switch 20_2 and the current flowing through the third switch 20_3. The third current detector including the Rogowski coil 21b_3 detects the sum of the current flowing through the third switch 20_3 and the current flowing through the fourth switch 20_4.

Figure 14:
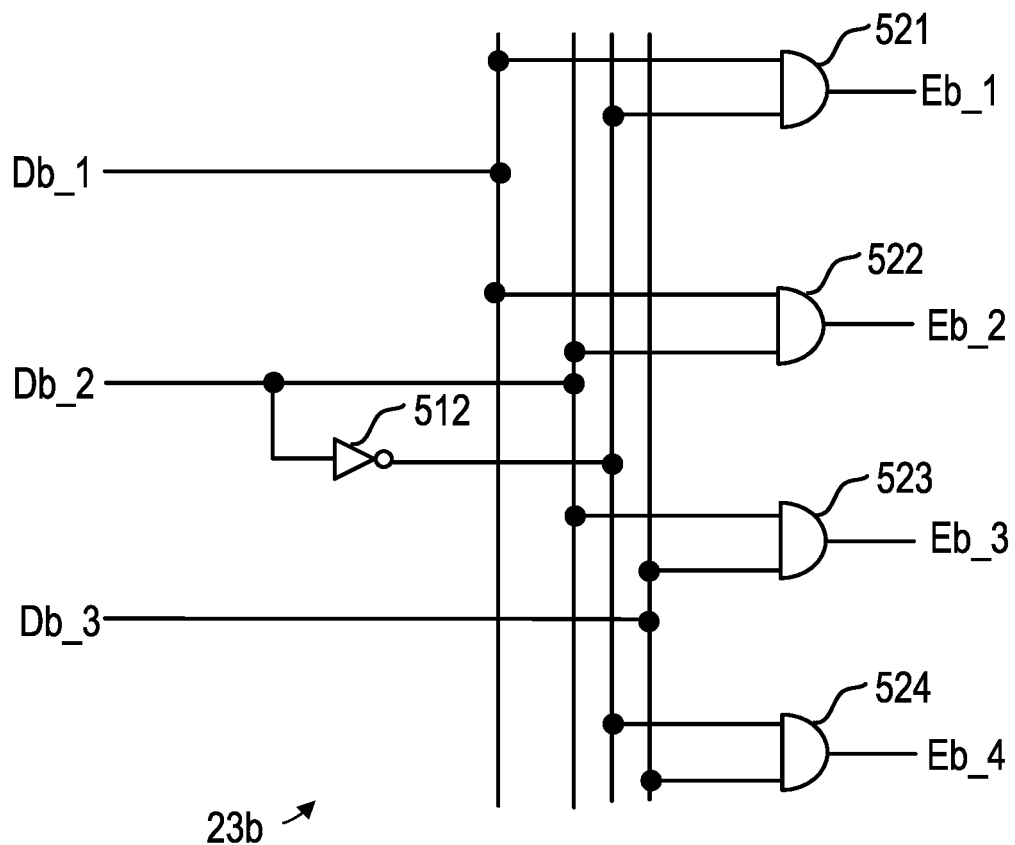
FIG. 14 is a block diagram of a configuration of a short circuit determiner corresponding to the Rogowski coils in FIG. 13.

FIG. 14 is a block diagram of a configuration of a short circuit determiner 23b in the second modification. In FIG. 14, the elements corresponding to the comparators 300a and 300b, and the elements corresponding to the on-delay operators 303a to 303c in FIG. 2 are omitted.

In FIG. 14, a signal Db_1 is active when a current detection value obtained by integrating the signal from the Rogowski coil 21b_1 is greater than the threshold TH. The signal Db_1 is inactive when the current detection value obtained by integrating the signal from the Rogowski coil 21b_1 is less than or equal to the threshold TH. A signal Db_2 is active when a current detection value obtained by integrating the signal from the Rogowski coil 21b_2 is greater than the threshold TH. The signal Db_2 is inactive when the current detection value obtained by integrating the signal from the Rogowski coil 21b_2 is less than or equal to the threshold TH. A signal Db_3 is active when a current detection value obtained by integrating the signal from the Rogowski coil 21b_3 is greater than the threshold TH. The signal Db_3 is inactive when the current detection value obtained by integrating the signal from the Rogowski coil 21b_3 is less than or equal to the threshold TH.

When the current detection value detected by the first current detector among the Ma current detectors is greater than the threshold TH and the current detection value detected by the second current detector is less than or equal to the threshold TH, the short circuit determiner 23b determines that a short circuit failure has occurred in the first switch.

In further detail, when the current detection value detected by the first current detector including the Rogowski coil 21b_1 is greater than the threshold TH, and the current detection value detected by the second current detector including the Rogowski coil 21b_2 is less than or equal to the threshold TH, the signal Db_1 and a signal obtained by inverting the signal Db_2 in a NOT operator 512 are active. In this case, an AND operator 521 sets a signal Eb_1 to active. The signal Eb_1 is a signal that specifies the first switch 20_1 as the point of occurrence of a short circuit failure.

When the current detection value detected by the Ma-th current detector among the Ma current detectors is greater than the threshold TH and the current detection value detected by the (Ma−1)-th current detector is less than or equal to the threshold TH, the short circuit determiner 23b determines that a short circuit failure has occurred in the M-th switch.

In further detail, when the current detection value detected by the Ma-th current detector including the Rogowski coil 21b_3 is greater than the threshold TH and the current detection value detected by the (Ma−1)-th current detector including the Rogowski coil 21b_2 is less than or equal to the threshold TH, the signal Db_3 and the signal obtained by inverting the signal Db_2 in the NOT operator 512 are active. In this case, an AND operator 524 sets a signal Eb_4 to active. The signal Eb_4 is a signal that specifies the fourth (M-th) switch 20_4 as the point of occurrence of a short circuit failure.

When both the current detection value detected by the N-th current detector among the Ma current detectors and the current detection value detected by the (N+1)-th current detector among the Ma current detectors are greater than the threshold TH, the short circuit determiner 23b determines that a short circuit failure has occurred in the (N+1)-th switch.

In further detail, when both the current detection value detected by the first current detector including the Rogowski coil 21b_1 and the current detection value detected by the second current detector including the Rogowski coil 21b_2 are greater than the threshold TH, the signal Db_1 and the signal Db_2 are active. In this case, an AND operator 522 sets a signal Eb_2 to active. The signal Eb_2 is a signal that specifies the second switch 20_2 as the point of occurrence of a short circuit failure.

When both the current detection value detected by the second current detector including the Rogowski coil 21b_2 and the current detection value detected by the third current detector including the Rogowski coil 21b_3 are greater than the threshold TH, the signal Db_2 and the signal Db_3 are active. In this case, an AND operator 523 sets a signal Eb_3 to active. The signal Eb_3 is a signal that specifies the third switch 20_3 as the point of occurrence of a short circuit failure.

Figure 15:
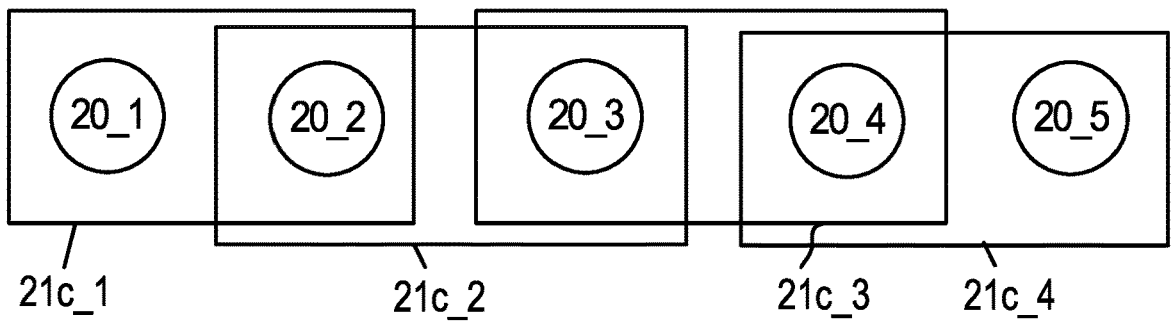
FIG. 15 is a diagram of an implementation example of Rogowski coils according to another aspect of the second modification.

FIG. 15 is a diagram of an implementation example of the Rogowski coils when M=5 and Ma=4 in the second modification. In FIG. 15, switches 20_1 to 20_5 are the first to fifth (M-th) switches, respectively. Rogowski coils 21c_1 to 21c_4 are included in the first to fourth (Ma-th) current detectors, respectively. As in FIG. 13, the N-th current detector among the Ma current detectors detects the sum of the respective currents flowing through the respective N-th and (N+1)-th switches, as the current detection value.

Figure 16:
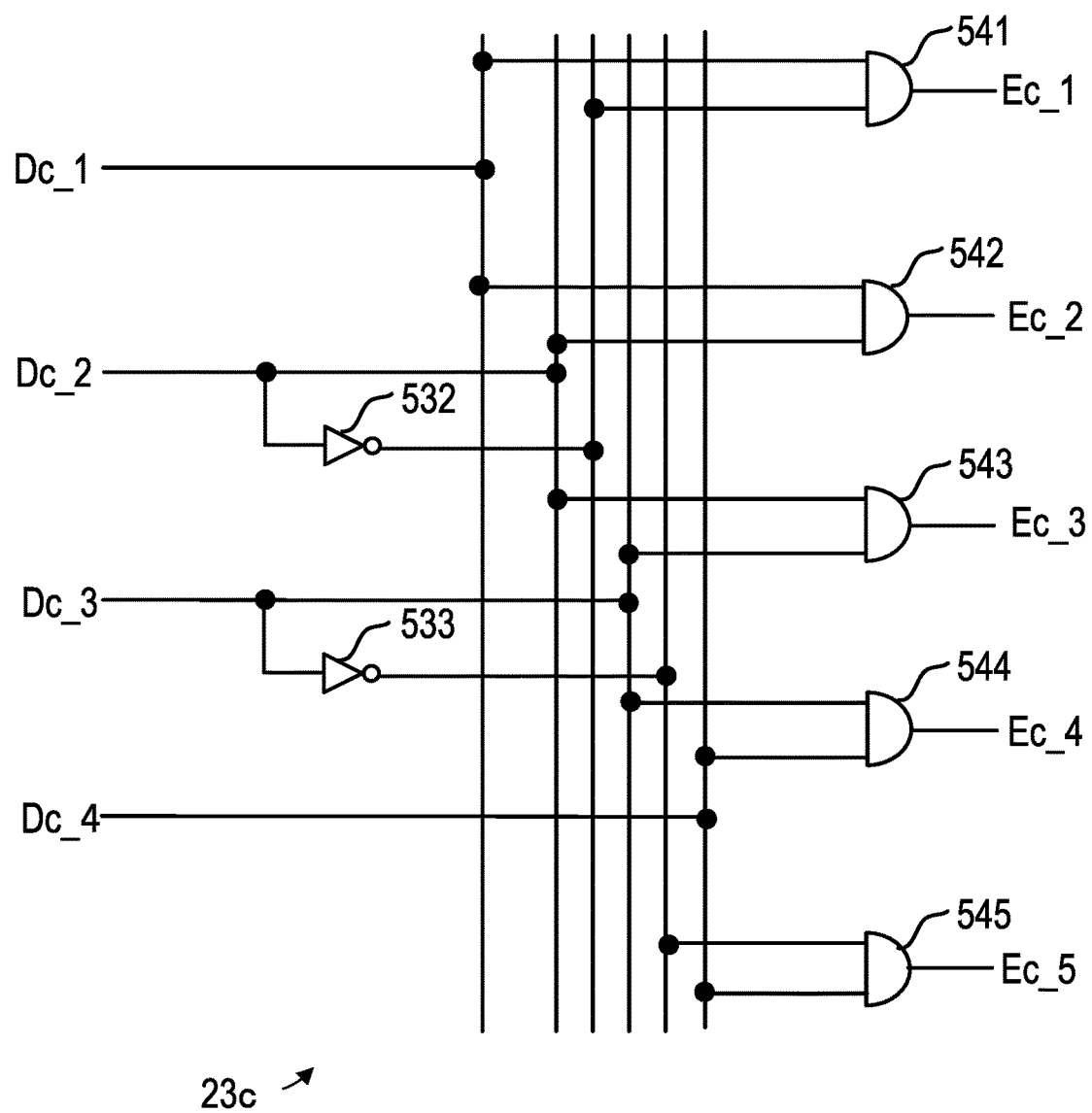
FIG. 16 is a block diagram of a configuration of a short circuit determiner corresponding to the Rogowski coils in FIG. 15.

FIG. 16 is a block diagram of a configuration of a short circuit determiner 23c corresponding to the configuration illustrated in FIG. 15. In FIG. 16, the elements corresponding to the comparators 300a and 300b and the elements corresponding to the on-delay operators 303a to 303c in FIG. 2 are omitted.

In FIG. 16, a signal Dc_1 is active when a current detection value obtained by integrating the signal from the Rogowski coil 21c_1 is greater than the threshold TH. The signal Dc_1 is inactive when the current detection value obtained by integrating the signal from the Rogowski coil 21c_1 is less than or equal to the threshold TH. A signal Dc_2 is active when a current detection value obtained by integrating the signal from the Rogowski coil 21c_2 is greater than the threshold TH. The signal Dc_2 is inactive when the current detection value obtained by integrating the signal from the Rogowski coil 21c_2 is less than or equal to the threshold TH. A signal Dc_3 is active when a current detection value obtained by integrating the signal from the Rogowski coil 21c_3 is greater than the threshold TH. The signal Dc_3 is inactive when the current detection value obtained by integrating the signal from the Rogowski coil 21c_3 is less than or equal to the threshold TH. A signal Dc_4 is active when a current detection value obtained by integrating the signal from the Rogowski coil 21c_4 is greater than the threshold TH. The signal Dc_4 is inactive when the current detection value obtained by integrating the signal from the Rogowski coil 21c_4 is less than or equal to the threshold TH.

When the current detection value detected by the first current detector including the Rogowski coil 21c_1 is greater than the threshold TH and the current detection value detected by the second current detector including the Rogowski coil 21c_2 is less than or equal to the threshold TH, the signal Dc_1 and a signal obtained by inverting the signal Dc_2 in a NOT operator 532 are active. In this case, an AND operator 541 sets a signal Ec_1 to active. The signal Ec_1 is a signal identifying the first switch 20_1 as the point of occurrence of a short circuit failure.

If the current detection value detected by the Ma-th current detector including the Rogowski coil 21c_4 is greater than the threshold TH and the current detection value detected by the (Ma−1)-th current detector including the Rogowski coil 21c_3 is less than or equal to the threshold TH, the signal Dc_4 and a signal obtained by inverting the signal Dc_3 in a NOT operator 533 are active. In this case, an AND operator 545 sets a signal Ec_5 to active. The signal Ec_5 is a signal identifying the fifth (M-th) switch 20_5 as the point of occurrence of a short circuit failure.

When both the current detection value detected by the first current detector including the Rogowski coil 21c_1 and the current detection value detected by the second current detector including the Rogowski coil 21c_2 are greater than the threshold TH, the signal Dc_1 and the signal Dc_2 are active. In this case, an AND operator 542 sets a signal Ec_2 to active. The signal Ec_2 is a signal identifying the second switch 20_2 as the point of occurrence of a short circuit failure.

In the same way, when the current detection values detected by the second and third current detectors are greater than the threshold TH, an AND operator 543 sets a signal Ec_3 to active. The signal Ec_3 is a signal identifying the third switch 20_3 as the point of occurrence of a short circuit failure. When the current detection values detected by the third and fourth current detectors are greater than the threshold TH, an AND operator 544 sets a signal Ec_4 to active. The signal Ec_4 is a signal identifying the fourth switch 20_4 as the point of occurrence of a short circuit failure.

According to the second modification, as in the above embodiment (see FIG. 1), the number of current detectors can be reduced compared to the number of switches connected to each other in parallel. In the above embodiment, for the M switches, the Ma (where, Ma=M−1) Rogowski coils are provided to detect the sum of the respective currents flowing through the respective Ma switches. Therefore, in a configuration in which the Ma Rogowski coils are provided in a multilayer printed circuit board, as the number of switches increases, the number of Rogowski coils which overlap in the overlap portion OV (see FIG. 6) increases. Therefore, a problem occurs in that the number of required layers of the multilayer printed circuit board increases. In contrast, in the second modification in which the Rogowski coils are provided in a multilayer printed circuit board, only two Rogowski coils, which include both the Rogowski coil in the N-th current detector and the Rogowski coil in the (N+1)-th current detector, overlap in the overlap portion OV (see FIG. 6). Therefore, the number of required layers of a multilayer printed circuit board can be reduced, thereby reducing manufacturing cost.

(3) Third Modification

The method of assigning the plurality of current detectors to the plurality of switches connected to each other in parallel is not limited to the method of the above embodiment. In an aspect illustrated in FIG. 17, for 16 switches 20_11 to 20_14, 20_21 to 20_24, 20_31 to 20_34, and, 20_41 to 20_44, a first group of current detectors including Rogowski coils 21x_1 to 21x_4, and a second group of current detectors including Rogowski coils 21y_1 to 21y_4 are assigned.

Each of the current detectors in the first group of current detectors detects the sum of respective currents flowing through respective groups of switches with no overlap obtained by a first division of the M switches. Specifically, a current detector including the Rogowski coil 21x_1 among the first group of current detectors detects the sum of the respective currents flowing through the respective switches 20_11, 20_12, 20_13, and 20_14 that constitute a group of switches. A current detector including the Rogowski coil 21x_2 among the first group of current detectors detects the sum of the respective currents flowing through the respective switches 20_21, 20_22, 20_23, and 20_24 that constitute a group of switches. A current detector including the Rogowski coil 21x_3 among the first group of current detectors detects the sum of the respective currents flowing through the respective switches 20_31, 20_32, 20_33, and 20_34 that constitute a group of switches. A current detector including the Rogowski coil 21x_4 among the first group of current detectors detects the sum of the respective currents flowing through the respective switches 20_41, 20_42, 20_43, and 20_44 that constitute a group of switches.

Each of the current detectors in the second group of current detectors detects the sum of respective currents flowing through respective groups of switches obtained by a second division of the M switches. The M switches are divided into the groups of switches by the second division so that switches that belong to the same group of switches among the groups of switches made by the first division do not belong to the same group of switches among the groups of switches made by the second division. Specifically, a current detector including the Rogowski coil 21y_1 among the second group of current detectors detects the sum of the respective currents flowing through the respective switches 20_11, 20_21, 20_31, and 20_41 that constitute a group of switches. A current detector including the Rogowski coil 21y_2 among the second group of current detectors detects the sum of the respective currents flowing through the respective switches 20_12, 20_22, 20_32, and 20_42 that constitute a group of switches. A current detector including the Rogowski coil 21y_3 among the second group of current detectors detects the sum of the respective currents flowing through the respective switches 20_13, 20_23, 20_33, and 20_43 that constitute a group of switches. A current detector including the Rogowski coil 21y_4 among the second group of current detectors detects the sum of the respective currents flowing through the respective switches 20_14, 20_24, 20_34, and 20_44 that constitute a group of switches.

Figure 17:
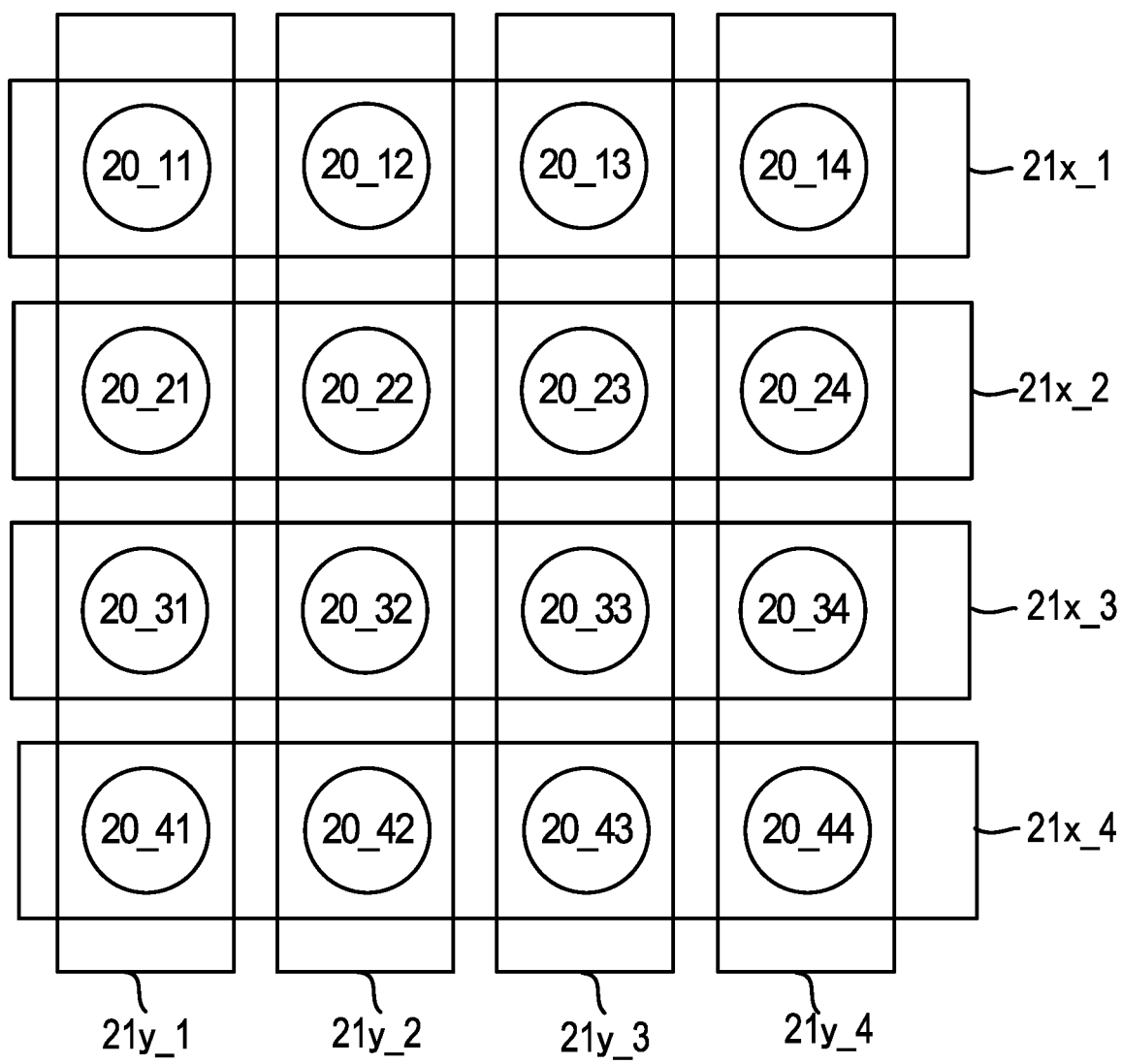
FIG. 17 is a diagram of an implementation example of Rogowski coils according to a third modification.
Figure 18:
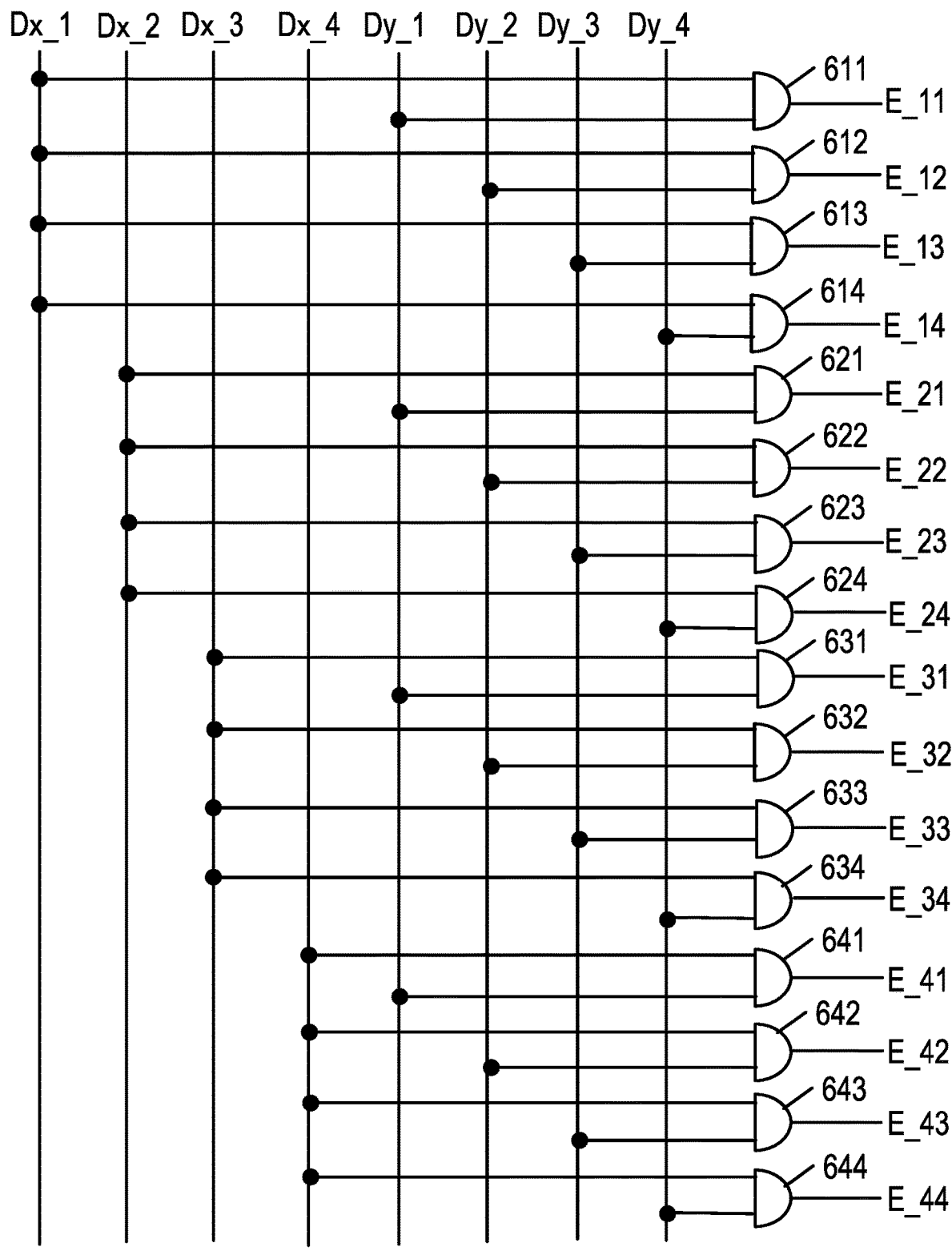
FIG. 18 is a block diagram of a configuration of a short circuit determiner corresponding to the Rogowski coils in FIG. 17.

FIG. 18 is a block diagram of a configuration of a short circuit determiner 23d corresponding to the configuration illustrated in FIG. 17. In FIG. 18, a signal Dx_1 is active when a current detection value obtained by integrating the signal from the Rogowski coil 21x_1 corresponding to the first group of current detectors is greater than the threshold TH. The signal Dx_1 is inactive when the current detection value obtained by integrating the signal from the Rogowski coil 21x_1 corresponding to the first group of current detectors is less than or equal to the threshold TH. A signal Dx_2 is active when a current detection value obtained by integrating the signal from the Rogowski coil 21x_2 corresponding to the first group of current detectors is greater than the threshold TH. The signal Dx_2 is inactive when the current detection value obtained by integrating the signal from the Rogowski coil 21x_1 corresponding to the first group of current detectors is less than or equal to the threshold TH. A signal Dx_3 is active when a current detection value obtained by integrating the signal from the Rogowski coil 21x_3 corresponding to the first group of current detectors is greater than the threshold TH. The signal Dx_3 is inactive when the current detection value obtained by integrating the signal from the Rogowski coil 21x_3 corresponding to the first group of current detectors is less than or equal to the threshold TH. A signal Dx_4 is active when a current detection value obtained by integrating the signal from the Rogowski coil 21x_4 corresponding to the first group of current detectors is greater than the threshold TH. The signal Dx_4 is inactive when the current detection value obtained by integrating the signal from the Rogowski coil 21x_4 corresponding to the first group of current detectors is less than or equal to the threshold TH. A signal Dy_1 is active when a current detection value obtained by integrating the signal from the Rogowski coil 21y_1 corresponding to the second group of current detectors is greater than the threshold TH. The signal Dy_1 is inactive when the current detection value obtained by integrating the signal from the Rogowski coil 21y_1 corresponding to the second group of current detectors is less than or equal to the threshold TH. A signal Dy_2 is active when a current detection value obtained by integrating the signal from the Rogowski coil 21y_2 corresponding to the second group of current detectors is greater than the threshold TH. The signal Dy_2 is inactive when the current detection value obtained by integrating the signal from the Rogowski coil 21y_2 corresponding to the second group of current detectors is less than or equal to the threshold TH. A signal Dy_3 is active when a current detection value obtained by integrating the signal from the Rogowski coil 21y_3 corresponding to the second group of current detectors is greater than the threshold TH. The signal Dy_3 is inactive when the current detection value obtained by integrating the signal from the Rogowski coil 21y_3 corresponding to the second group of current detectors is less than or equal to the threshold TH. A signal Dy_4 is active when a current detection value obtained by integrating the signal from the Rogowski coil 21y_4 corresponding to the second group of current detectors is greater than the threshold TH. The signal Dy_4 is inactive when the current detection value obtained by integrating the signal from the Rogowski coil 21y_4 corresponding to the second group of current detectors is less than or equal to the threshold TH. The short circuit determiner 23d includes AND operators 611 to 614, AND operators 621 to 624, AND operators 631 to 634, and AND operators 641 to 644. The AND operators 611 to 614 output signals E_11 to E_14 that identify the point of occurrence of a short circuit failure, respectively. The AND operators 621 to 624 output signals E_21 to E_24 that identify the point of occurrence of a short circuit failure, respectively. The AND operators 631 to 634 output signals E_31 to E_34 that identify the point of occurrence of a short circuit failure, respectively. The AND operators 641 to 644 output signals E_41 to E_44 that identify the point of occurrence of a short circuit failure, respectively.

When the first group of current detectors includes a first current detector that outputs a current detection value greater than the threshold TH and the second group of current detectors includes a second current detector that outputs a current detection value greater than the threshold TH, the short circuit determiner 23d determines that a short circuit failure occurs in a switch that is a common current detection target of both the first current detector and the second current detector.

For example, when the current detection value obtained by integrating the signal from the Rogowski coil 21x_2 in the first group of current detectors is greater than the threshold TH and the current detection value obtained by integrating the signal from the Rogowski coil 21x_3 in the second group of current detectors is greater than the threshold TH, the signals Dx_2 and Dy_3 are active. In this case, the AND operator 623 sets a signal E_23 to active. The signal E_23 is a signal identifying a switch that is a common current detection target of both the Rogowski coil 21x_2 and the Rogowski coil 21y_3, as the point of occurrence of a short circuit failure.

According to the third modification, when the number of switches connected to each other in parallel is large, the number of current detectors can be reduced compared to the above embodiment.

(4) Fourth Modification

In the third modification, the first division may be division by which one group of switches that is not a target of current detection is generated in addition to groups of switches other than the one group of switches being targets of current detection. In this case, when the second group of current detectors includes a third current detector that outputs a current detection value greater than the threshold TH and the first group of current detectors does not include a current detector that outputs a current detection value greater than the threshold TH, the short circuit determiner 23 (see FIG. 1) may determine that a short circuit failure has occurred in a switch that is a current detection target of the third current detector and that belongs to the group of switches that is not the target of the current detection.

Figure 19:
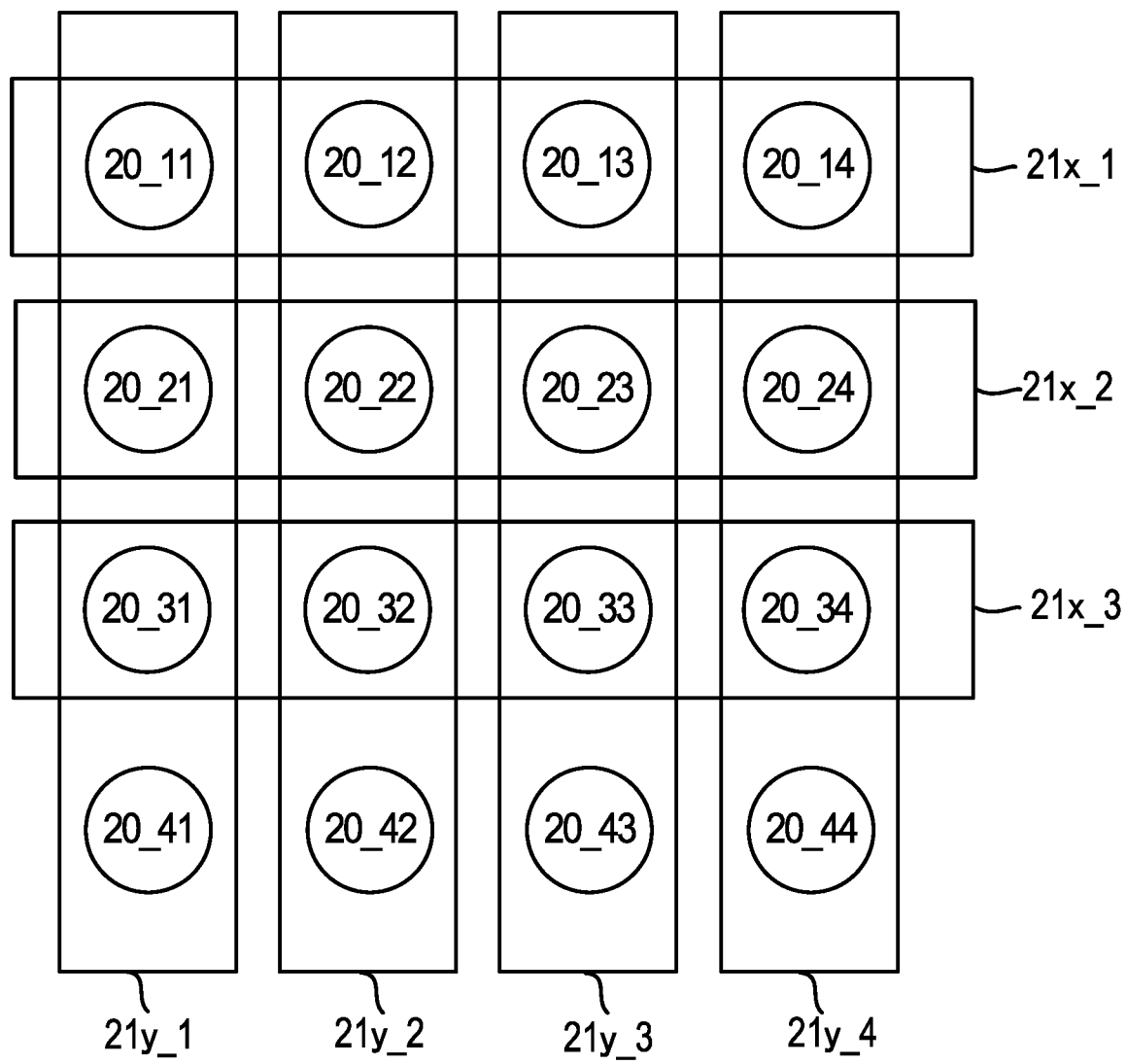
FIG. 19 is a diagram of an implementation example of Rogowski coils according to a fourth modification.

FIG. 19 is a diagram of an example of a configuration of the fourth modification. In FIG. 19, a group of switches including the switches 20_41, 20_42, 20_43, and 20_44 is set as a group that is not a target of the current detection, and the Rogowski coil 21x_4 illustrated in FIG. 17 is omitted.

Figure 20:
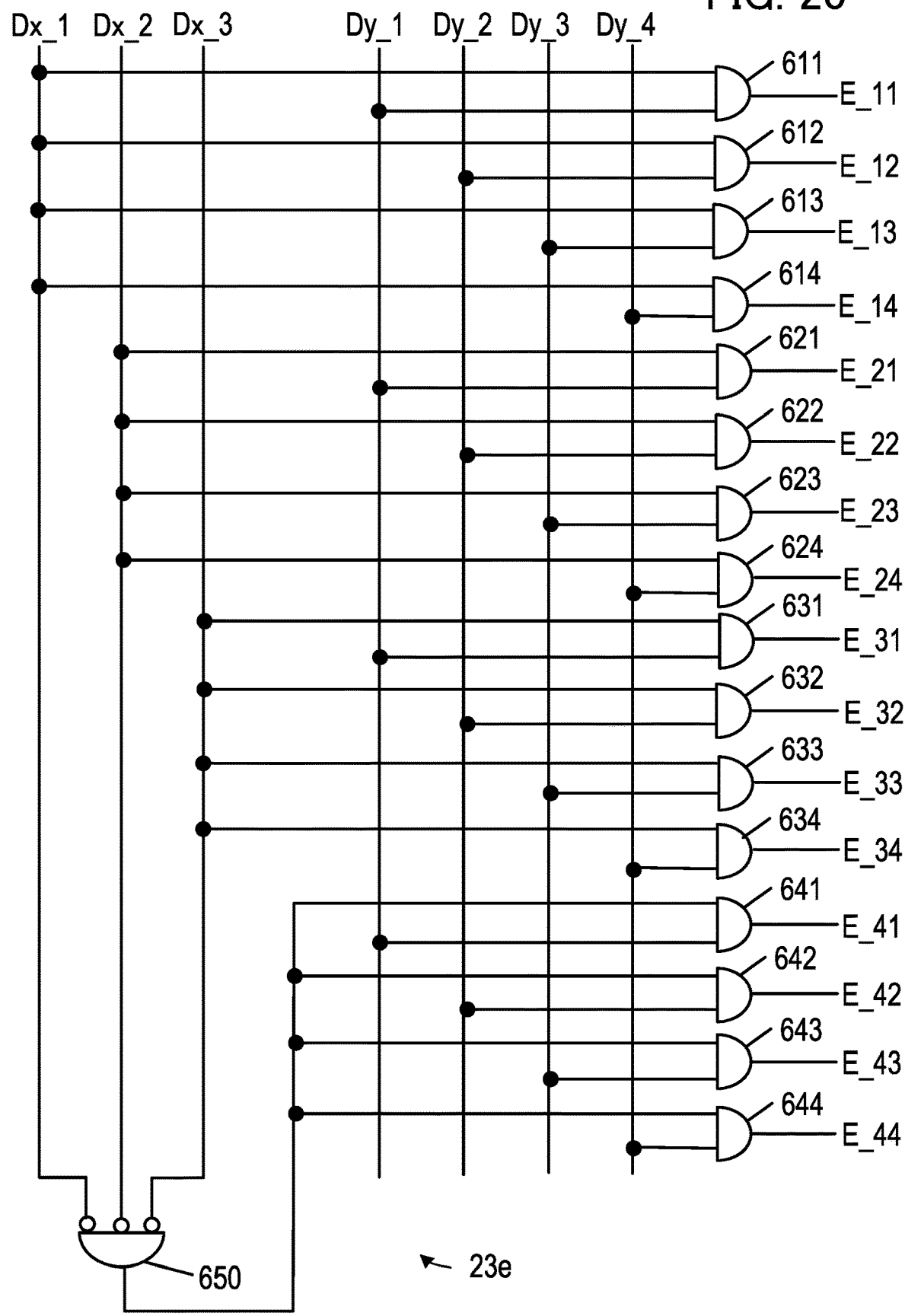
FIG. 20 is a block diagram of a configuration of a short circuit determiner corresponding to the Rogowski coils in FIG. 19.

FIG. 20 is a block diagram of a configuration of a short circuit determiner 23e corresponding to the configuration illustrated in FIG. 19. In FIG. 20, the signal Dx_4 in FIG. 18 is omitted, and an AND operator 650 with a negative logic input (or input low active) is provided instead. The AND operator 650 sets a signal supplied to the AND operators 641 to 644 to be active when the first group of current detectors does not include a current detector that outputs a current detection value greater than the threshold TH, that is, when each of the signals Dx_1, Dx_2, and Dx_3 is inactive.

In the fourth modification, operations in a situation in which the first group of current detectors includes a current detector that outputs a current detection value greater than the threshold TH is the same as the operations of the short circuit determiner 23d in FIG. 19. However, operations in a situation in which the first group of current detectors does not include a current detector that outputs the current detection value greater than the threshold TH is different from the operations of the short circuit determiner 23d in FIG. 19. For example, when the first group of current detectors does not include a current detector that outputs a current detection value greater than the threshold TH, and the current detection value obtained by integrating the signal from the Rogowski coil 21y_1 in the second group of current detectors is greater than the threshold TH, the output signal of the AND operator 650 and the signal Dy_1 are active. In this case, the switch 20_41 is at the point of occurrence of a short circuit failure. The switch 20_41 belongs to both current detection targets of the Rogowski coil 21y_1 in the current detector that outputs the current detection value greater than the threshold TH and a group of the switches 20_41, 20_42, 20_43, and 20_44 that are not current detection targets. The AND operator 641 sets the signal E_41 to active. The signal E_41 is a signal identifying the switch 20_41 as the point of occurrence of a short circuit failure.

According to the fourth modification, the number of current detectors can be further reduced than in that of the third modification.

(5) Fifth Modification

In the above embodiment, the Rogowski coils 21_1 and 21_2 are provided around the current path connected to any of the sources of the power switches 27a, 27b, and 27c connected to each other in parallel. However, the Rogowski coils 21_1 and 21_2 may be provided around a current path connected to any of the drains of the power switches 27a, 27b, and 27c.

(6) Sixth Modification

In the above embodiment, the current detection values Si1 and Si2 are respectively generated by integrating the detection signals Vi1 and Vi2 obtained from the Rogowski coils 21_1 and 21_2, respectively. A determination on a short circuit failure is made by comparing each of the current detection values Si1 and Si2 with the threshold TH. Instead, the determination of a short circuit failure may be made by comparing each of the detection signals Vi1 and Vi2 obtained from the Rogowski coils 21_1 and 21_2 with the threshold TH. In this case, each of the detection signals Vi1 and Vi2 is an example of a current detection value.

(7) Seventh Modification

When it is not necessary to identify the switch in which a short circuit failure occurs among the switches in the above embodiment, a single Rogowski coil may detect the sum of the respective currents flowing through all respective switches.

(8) Eighth Modification

This disclosure may be applied to power conversion apparatuses other than inverters, such as DC/DC converters.

(9) Ninth Modification

In the above embodiment, a MOSFET is used as an example of a power switch. However, the power switch is not limited thereto and may be any other power switch, such as an Insulated Gate Bipolar Transistor (IGBT).

(10) Tenth Modification

In the above embodiment, a Rogowski coil is used as a current detector, but other types of current detectors such as a shunt resistor or a current transformer (CT) may be used.

DESCRIPTION OF REFERENCE SIGNS

100 . . . power conversion apparatus, 200 . . . higher level apparatus, 2a, 2b . . . driver, 1 . . . controller, 20a, 20b, 20c, 20_1 to 20_5, 20_11 to 20_14, 20_21 to 20_24, 20_31 to 20_34, 20_41 to 20_44 . . . switch, 27a, 27b, 27c . . . power switch, 28a, 28b, 28c . . . diode, 24 . . . drive controller, 50 . . . short circuit protection apparatus, 21_1, 21_2, 21a_1, 21a_2, 21a_3, 21b_1, 21b_2, 21b_3, 21c_1, 21x_2, 21c_3, 21c_4, 21x_1 to 21x_4, 21y_1 to 21y_4 . . . Rogowski coil, 21_1_C, 21_2_C . . . coil, 21_1_R, 21_2_R . . . return line, 22_1, 22_2 . . . integrator, 23, 23a, 23b, 23c . . . 23d, 23e . . . short circuit determiner, 300a, 300b . . . comparator, 301 . . . OR operator, 302a, 302b, 302c, 421-424, 521-524, 541-545, 611-614, 621-624, 631-634, 641-644 . . . AND operator, 303a, 303b, 303c . . . ON DELAY operator, 304a, 304b, 411-413, 512, 532, 533 . . . NOT operator, 400 . . . board, 400a, 400b . . . multilayer printed circuit board.

What is claimed is:

1. A short circuit protection apparatus for a power conversion apparatus supplying power to a load via a plurality of switches connected to each other in parallel, the short circuit protection apparatus comprising:

Ma current detectors each configured to detect a sum of currents flowing through two or more switches among the plurality of switches to output a detection signal indicative of the sum that is detected, wherein Ma is 1 less than M, which is a number of the plurality of switches; and a short circuit determiner configured to determine, based on detection signals obtained from the respective Ma current detectors, occurrence of a short circuit failure in the plurality of switches to output a cutoff instruction signal for stopping on-off drive of the plurality of switches, wherein:

an N-th current detector among the Ma current detectors is configured to detect a sum of currents flowing through all switches other than an N-th switch from among a first switch to an M-th switch constituting the M switches, as a current detection value, N being an integer from 1 to Ma, the short circuit determiner is configured to:

when each and every current detection value detected by the respective Ma current detectors is greater than a threshold, determine occurrence of a short circuit failure in the M-th switch;

when a first current detection value detected by a first current detector among the Ma current detectors is less than or equal to the threshold and each of current detection values detected by (Ma−1) second current detectors other than the first current detector is greater than the threshold, where M is greater than 3, determine occurrence of short circuit failure in a switch for which a current was not detected by the first current detector; and when the first current detection value detected by the first current detector among the Ma current detectors is less than or equal to the threshold and a current detection value detected by an (Ma−1) second current detector other than the first current detector is greater than the threshold, where M is equal to 3, determine occurrence of short circuit failure in a switch for which a current was not detected by the first current detector.

2. The short circuit protection apparatus according to claim 1, wherein each of the Ma current detectors includes a Rogowski coil.

3. The short circuit protection apparatus according to claim 2, wherein the Ma current detectors include both a first current detector including a first Rogowski coil with a return line and a second current detector including a second Rogowski coil with a return line, the first Rogowski coil and the second Rogowski coil are provided on a board, the return line of the first Rogowski coil in an overlap portion between the first Rogowski coil and the second Rogowski coil is farther from the return line of the second Rogowski coil than from a central axis of the first Rogowski coil.

4. The short circuit protection apparatus according to claim 3, wherein the Ma current detectors include both a first current detector including a first Rogowski coil and a second current detector including a second Rogowski coil, the first Rogowski coil and the second Rogowski coil are provided on a board, the first Rogowski coil and the second Rogowski coil are arranged alternately in an overlap portion between the first Rogowski coil and the second Rogowski coil.

5. The short circuit protection apparatus according to claim 1, wherein the plurality of switches each include a wide gap semiconductor.

6. A short circuit protection apparatus for a power conversion apparatus supplying power to a load via a plurality of switches connected to each other in parallel, the short circuit protection apparatus comprising:

Ma current detectors, each configured to detect a sum of currents flowing through two or more switches among the plurality of switches to output a detection signal indicative of the sum that is detected, wherein Ma is 1 less than M, which is a number of the plurality of switches; and a short circuit determiner configured to determine, based on detection signals obtained from the respective Ma current detectors, occurrence of short circuit failure in the plurality of switches to output a cutoff instruction signal for stopping on-off drive of the plurality of switches, wherein:

an N-th current detector among the Ma current detectors is configured to detect a sum of currents flowing through respective N-th and (N+1)-th switches from among a first switch to an M-th switch constituting the M switches, as a current detection value, N being an integer from 1 to Ma, the Ma current detectors include a first current detector to an Ma-th current detector, the short circuit determiner is configured to:

when a current detection value detected by the first current detector among the Ma current detectors is greater than the threshold, and a current detection value detected by a second current detector among the Ma current detectors is less than or equal to the threshold, determine occurrence of a short circuit failure in the first switch;

when a current detection value detected by the Ma-th current detector among the Ma current detectors is greater than the threshold and a current detection value detected by an (Ma−1)th current detector among the Ma current detectors is less than or equal to the threshold, determine occurrence of short circuit failure in the M-th switch; and when both a current detection value detected by an a P-th current detector among first to (Ma−1)-th current detectors of the Ma current detectors and a current detection value detected by a (P+1)-th current detector among the Ma current detectors are greater than the threshold, determine occurrence of short circuit failure in a (P+1)-th switch.

* * * * *

UNITED STATES PATENT AND TRADEMARK OFFICE
CERTIFICATE OF CORRECTION

| | | |
|---|---|---|
| PATENT NO. | : 11,705,805 B2 | Page 1 of 1 |
| APPLICATION NO. | : 17/589211 | |
| DATED | : July 18, 2023 | |
| INVENTOR(S) | : Yasunao Saga | |

It is certified that error appears in the above-identified patent and that said Letters Patent is hereby corrected as shown below:

In the Claims

Column 22, Line 66:
Claim 6, delete "an a" and insert --a--.

Signed and Sealed this
Twenty-fourth Day of October, 2023

Katherine Kelly Vidal
*Director of the United States Patent and Trademark Office*